United States Patent
Ozoe

(10) Patent No.: US 8,018,008 B2
(45) Date of Patent: Sep. 13, 2011

(54) SEMICONDUCTOR DEVICE INCLUDING A PLURALITY OF CHIPS AND METHOD OF MANUFACTURING SEMICONDUCTOR DEVICE

(75) Inventor: Shoji Ozoe, Chita-gun (JP)

(73) Assignee: DENSO CORPORATION, Kariya (JP)

( * ) Notice: Subject to any disclaimer, the term of this patent is extended or adjusted under 35 U.S.C. 154(b) by 312 days.

(21) Appl. No.: 12/385,815

(22) Filed: Apr. 21, 2009

(65) Prior Publication Data

US 2009/0278167 A1 Nov. 12, 2009

(30) Foreign Application Priority Data

May 8, 2008 (JP) ................................ 2008-122149
Mar. 4, 2009 (JP) ................................ 2009-050455

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. . 257/401; 257/341; 257/342; 257/E21.614; 257/E25.027; 257/E27.026; 257/E27.027

(58) Field of Classification Search ................ 257/341, 257/342, 401, E21.614, E25.027, E27.026, 257/E27.027
See application file for complete search history.

(56) References Cited

U.S. PATENT DOCUMENTS

| | | | |
|---|---|---|---|
| 6,055,148 A | 4/2000 | Grover | 361/103 |
| 6,627,953 B1 * | 9/2003 | Vu et al. | 257/347 |
| 6,653,740 B2 | 11/2003 | Kinzer et al. | 257/778 |
| 6,995,473 B2 | 2/2006 | Kitabatake et al. | 257/777 |
| 7,312,487 B2 * | 12/2007 | Alam et al. | 257/278 |
| 7,485,508 B2 * | 2/2009 | Dyer et al. | 438/154 |
| 7,521,786 B2 | 4/2009 | Kitabatake et al. | 257/686 |
| 7,589,375 B2 * | 9/2009 | Jang et al. | 257/316 |
| 7,602,028 B2 * | 10/2009 | Son et al. | 257/390 |
| 7,626,228 B2 * | 12/2009 | Park et al. | 257/326 |
| 7,642,555 B2 * | 1/2010 | Ishikawa | 257/60 |
| 7,655,948 B2 * | 2/2010 | Oh | 257/59 |
| 7,723,764 B2 * | 5/2010 | Oohata et al. | 257/292 |
| 7,723,851 B2 * | 5/2010 | La Tulipe et al. | 257/761 |

(Continued)

FOREIGN PATENT DOCUMENTS

JP 04-256357 A 9/1992

(Continued)

OTHER PUBLICATIONS

Notice of Reasons for Refusal mailed on May 25, 2010 issued from the Japanese Patent Office in the corresponding Japanese patent application No. 2009-050455 (with English translation).

Primary Examiner — Ida M Soward

(74) Attorney, Agent, or Firm — Posz Law Group, PLC

(57) ABSTRACT

A semiconductor device includes a first chip and a second chip. The first chip includes a first conductivity type channel power MOSFET. The second chip includes a second conductivity type channel power MOSFET. The first chip and the second chip are integrated in such a manner that a second-surface drain electrode of the first chip and a second-surface drain electrode of the second chip face to each other and are electrically coupled with each other through a conductive material.

15 Claims, 15 Drawing Sheets

U.S. PATENT DOCUMENTS

| | | | |
|---|---|---|---|
| 7,741,644 B2 * | 6/2010 | Lyu et al. | 257/67 |
| 7,795,651 B2 * | 9/2010 | Jeong et al. | 257/278 |
| 2004/0021233 A1 | 2/2004 | Kinzer et al. | 257/778 |
| 2005/0017339 A1 | 1/2005 | Yoshiba et al. | 257/686 |
| 2007/0075419 A1 | 4/2007 | Fukuda et al. | 257/717 |
| 2008/0031048 A1 * | 2/2008 | Jeong et al. | 365/185.17 |
| 2008/0239271 A1 | 10/2008 | Maeda | 355/67 |

FOREIGN PATENT DOCUMENTS

| | | |
|---|---|---|
| JP | 10-223835 A | 8/1998 |
| JP | A-11-274482 | 10/1999 |
| JP | A-2006-344779 | 12/2006 |
| JP | A-2007-13003 | 1/2007 |
| JP | A-2008-244388 | 10/2008 |

* cited by examiner

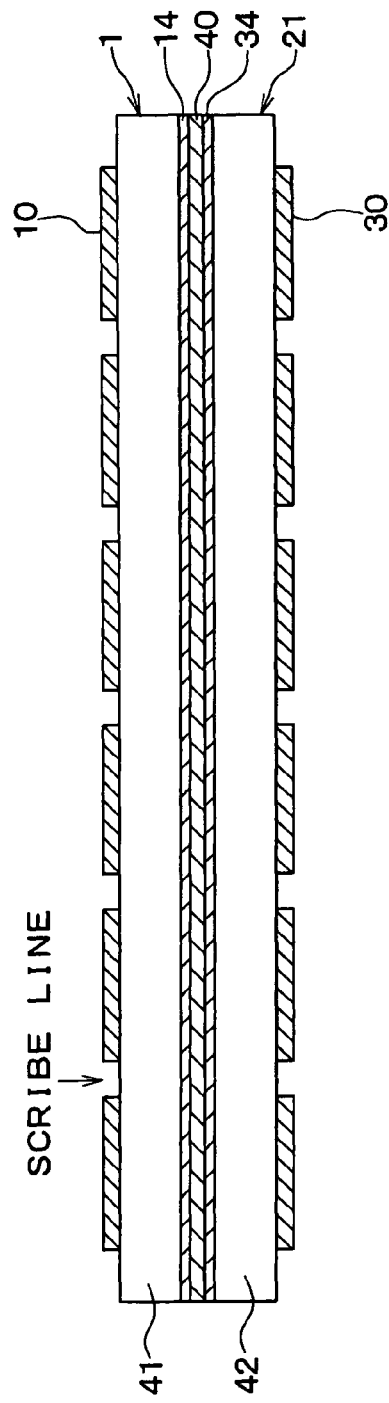
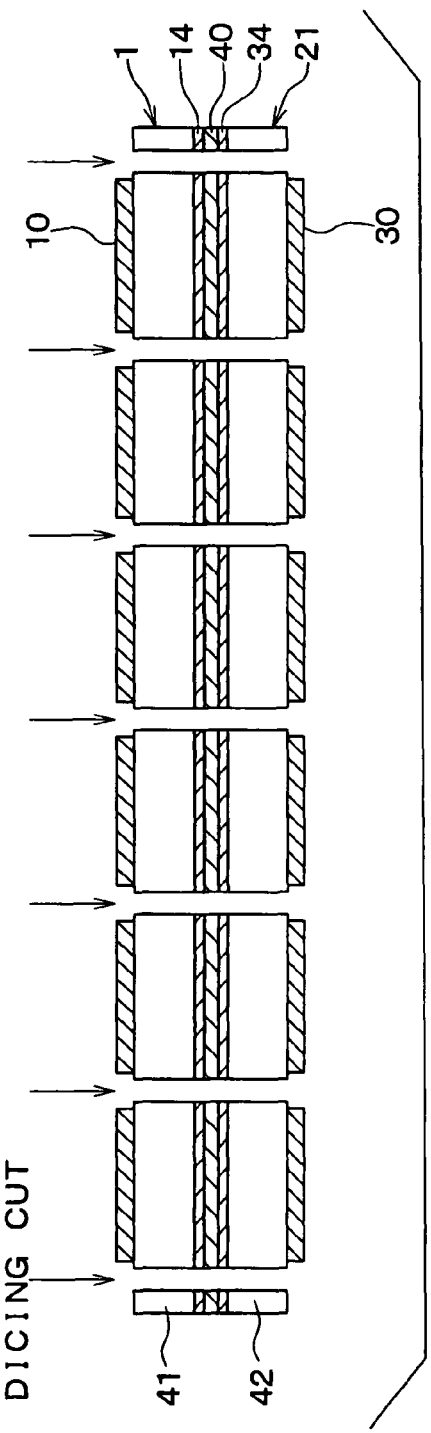

SCRIBE LINE

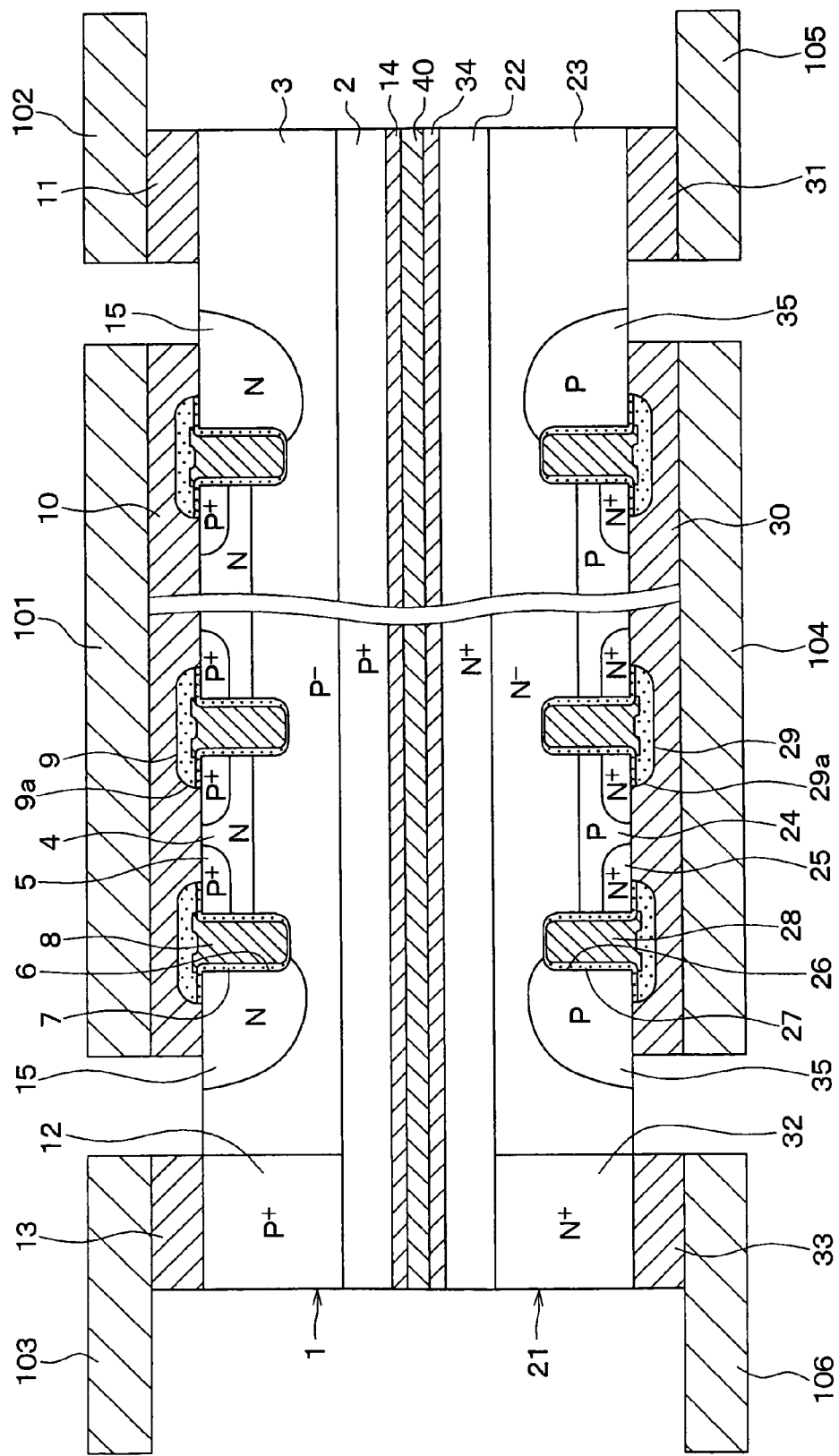

SEMICONDUCTOR DEVICE INCLUDING A PLURALITY OF CHIPS AND METHOD OF MANUFACTURING SEMICONDUCTOR DEVICE

CROSS REFERENCE TO RELATED APPLICATIONS

The present application is based on and claims priority to Japanese Patent Applications No. 2008-122149 filed on May 8, 2008, and No. 2009-050455 filed on Mar. 4, 2009, the contents of which are incorporated in their entirety herein by reference.

BACKGROUND OF THE INVENTION

1. Field of the Invention

The present invention relates to a semiconductor device including a plurality of chips. The present invention also relates to a method of manufacturing a semiconductor device.

2. Description of the Related Art

Conventionally, a power device such as a power metal-oxide semiconductor field-effect transistor (power MOSFET) and an insulated gate bipolar transistor (IGBT) is used for driving a load such as a motor. In a case where a full bridge circuit is assembled from power devices for driving a motor, four power devices are required for driving a brush motor and six power devices are required for driving a brushless motor. Thus, when a plurality of power devices is formed on one plane of a chip or when a plurality of power devices is formed on respective chips and the chips are arranged on one plane, a dimension of a substrate is difficult to be reduced.

US 2007/0075419 A (corresponding to JP-A-2007-73674) discloses a semiconductor device that includes a metal frame functioning as a drain electrode and a plurality of vertical power devices formed on a front surface and a rear surface of the lead frame. In the semiconductor device, the vertical power devices and the lead frame are stacked. Thus, a dimension of a substrate can be reduced.

However, in the above-described semiconductor device, the lead frame is disposed between respective semiconductor elements. Thus, a mounting dimension may be increased.

SUMMARY OF THE INVENTION

In view of the foregoing problems, it is an object of the present invention to provide a semiconductor device including a plurality of chips. Another object of the present invention is to provide a method of manufacturing a semiconductor device.

A semiconductor device according to a first aspect of the present invention includes a first chip and a second chip. The first chip includes a first conductivity-type channel power MOSFET. The first conductivity-type channel power MOSFET includes a first semiconductor substrate of the first conductivity type having first and second opposing surfaces, a drift layer of the first conductivity type disposed on the first surface of the first semiconductor substrate and having a cell section, a channel layer of a second conductivity type disposed at a surface portion of the cell section of the drift layer, a source region of the first conductivity type disposed at a surface portion of the channel layer, a gate insulating layer disposed on a channel region provided at a portion of the channel layer located between the source region and the drift layer, a gate-electrode disposed on an opposite side of the gate insulating layer from the channel region, a source electrode electrically coupled with the channel layer and the source region, and a second-surface drain electrode disposed on the second surface of the first semiconductor substrate. The second chip includes a second conductivity-type channel power MOSFET. The second conductivity-type channel power MOSFET includes a second semiconductor substrate of the second conductivity type having first and second opposing surfaces, a drift layer of the second conductivity type disposed on the first surface of the second semiconductor substrate and having a cell section, a channel layer of the first conductivity type disposed at a surface portion of the cell section of the drift layer, a source region of the second conductivity type disposed at a surface portion of the channel layer, a gate insulating layer disposed on a channel region provided at a portion of the channel layer located between the source region and the drift layer, a gate electrode disposed on an opposite side of the gate insulating layer from the channel region, a source electrode electrically coupled with the channel layer and the source region, and a second-surface drain electrode disposed on the second surface of the second semiconductor substrate. The first chip and the second chip are integrated in such a manner that the second-surface drain electrode of the first chip and the second-surface drain electrode of the second chip face to each other and are electrically coupled with each other through a conductive material.

In the semiconductor device according to the first aspect, the first chip and the second chip can be integrated by attaching the second-surface drain electrode of the first chip to the second-surface drain electrode of the second chip. Thus, a lead frame is not required to be disposed between the first chip and the second chip. Therefore, a dimension of the semiconductor device can be reduced compared with a case where the lead frame is disposed.

The semiconductor device according to the first aspect can be manufactured, for example, by a method including: preparing a first wafer for forming a plurality of the first chips and a second wafer for forming a plurality of the second chips; forming the first conductivity-type channel power MOSFET in the first wafer; forming the second conductivity-type channel power MOSFET in the second wafer; arranging the first wafer and the second wafer in such a manner that the second-surface drain electrode of the first wafer faces to the second-surface drain electrode of the second wafer; electrically coupling the second-surface drain electrode of the first wafer with the second-surface drain electrode of the second wafer through the conductive material so that the first wafer and the second wafer are integrated; and dicing the integrated first wafer and second wafer into chips.

A semiconductor device according to a second aspect of the present invention includes a first chip and a second chip. The first chip includes a first conductivity-type channel power MOSFET. The first conductivity-type channel power MOSFET includes a first semiconductor substrate of the first conductivity type having first and second opposing surfaces, a drift layer of the first conductivity type disposed on the first surface of the first semiconductor substrate and having a cell section, a channel layer of a second conductivity type disposed at a surface portion of the cell section of the drift layer, a source region of the first conductivity type disposed at a surface portion of the channel layer, a gate insulating layer disposed on a channel region provided at a portion of the channel layer located between the source region and the drift layer, a gate electrode disposed on an opposite side of the gate insulating layer from the channel region, a source electrode electrically coupled with the channel layer and the source region, and a second-surface drain electrode disposed on the second surface of the first semiconductor substrate. The second chip includes a first conductivity-type channel power MOSFET. The first conductivity-type channel power MOSFET includes a second semiconductor substrate of the first conductivity type having first and second opposing surfaces, a drift layer of the first conductivity type disposed on the first surface of the second semiconductor substrate and having a cell section, a channel layer of the second conductivity type disposed at a surface portion of the cell section of the drift layer, a source region of the first conductivity type disposed at a surface portion of the channel layer, a gate insulating layer disposed on a channel region provided at a portion of the channel layer located between the source region and the drift layer, a gate electrode disposed on an opposite side of the gate insulating layer from the channel region, a source electrode electrically coupled with the channel layer and the source region, and a second-surface drain electrode disposed on the second surface of the second semiconductor substrate. The first chip and the second chip are integrated in such a manner that the second-surface drain electrode of the first chip and source electrode of the second chip face to each other and are electrically coupled with each other through a conductive material.

In the semiconductor device according to the second aspect, the first chip and the second chip can be integrated by attaching the second-surface drain electrode of the first chip to the source electrode of the second chip. Thus, a lead frame is not required to be disposed between the first chip and the second chip. Therefore, a dimension of the semiconductor device can be reduced compared with a case where the lead frame is disposed.

The semiconductor device according to the second aspect can be manufactured, for example, by a method including: preparing a first wafer for forming a plurality of the first chips and a second wafer for forming a plurality of the second chips; forming the first conductivity-type channel power MOSFET in the first wafer; forming the first conductivity-type channel power MOSFET in the second wafer; arranging the first wafer and the second wafer in such a manner that the second-surface drain electrode of the first wafer faces to the source electrode of the second wafer; electrically coupling the second-surface drain electrode of the first wafer with the source electrode of the second wafer through the conductive material so that the first wafer and the second wafer are integrated; and dicing the integrated first wafer and second wafer into chips.

A semiconductor device according to a third aspect includes a first chip and a second chip. The first chip includes a second conductivity-type channel IGBT. The second conductivity-type channel IGBT includes a first semiconductor substrate of a first conductivity type having first and second opposing surfaces, a drift layer of the second conductivity type disposed to the first surface side of the first semiconductor substrate and having a cell section, a channel layer of the first conductivity type disposed at a surface portion of the cell section of the drift layer, an emitter region of the second conductivity type disposed at a surface portion of the channel layer, a gate insulating layer disposed on a channel region provided at a portion of the channel layer located between the emitter region and the drift layer, a gate electrode disposed on an opposite side of the gate insulating layer from the channel region, an emitter electrode electrically coupled with the channel layer and the emitter region, a second-surface collector electrode disposed on the second surface of the first semiconductor substrate. The second chip includes a second conductivity-type channel power MOSFET. The second conductivity type channel power MOSFET includes a second semiconductor substrate of the second conductivity type having first and second opposing surfaces, a drift layer of the second conductivity-type disposed on the first surface of the second semiconductor substrate and having a cell section, a channel layer of the first conductivity type disposed at a surface portion of the cell section of the drift layer, a source region of the second conductivity type disposed at a surface portion of the channel layer, a gate insulating layer disposed on a channel region provided at a portion of the channel layer located between the source region and the drift layer, a gate electrode disposed on an opposite side of the gate insulating layer from the channel region, a source electrode electrically coupled with the channel layer and the source region, a second-surface drain electrode disposed on the second surface of the second semiconductor substrate. The first chip and the second chip are integrated in such a manner that the emitter electrode of the first chip and the source electrode of the second chip face to each other and are electrically coupled with each other through a conductive material.

In the semiconductor device according to the third aspect, the first chip and the second chip can be integrated by attaching the emitter electrode of the first chip to the source electrode of the second chip. Thus, a lead frame is not required to be disposed between the first chip and the second chip. Therefore, a dimension of the semiconductor device can be reduced compared with a case where the lead frame is disposed.

The semiconductor device according to the third aspect can be manufactured, for example, by a method including: preparing a first wafer for forming a plurality of the first chips and a second wafer for forming a plurality of the second chips; forming the second conductivity type channel IGBT in the first wafer; forming the second conductivity type channel power MOSFET in the second wafer; arranging the first wafer and the second wafer in such a manner that the emitter electrode of the first wafer faces to the source electrode of the second wafer; electrically coupling the emitter electrode of the first wafer with the source electrode of the second wafer through the conductive material so that the first wafer and the second wafer are integrated; and dicing the integrated first wafer and second wafer into chips.

A semiconductor device according to a fourth aspect of the present invention includes a first chip and a second chip. The first chip includes a first semiconductor substrate and one of an electronic circuit and a circuit wiring formed in the semiconductor substrate. The first semiconductor substrate has one of a first conductivity type and a second conductivity type and has first and second opposing surfaces. The second chip includes a second conductivity-type channel power MOSFET. The second conductivity type channel power MOSFET includes a second semiconductor substrate of the second conductivity type having first and second opposing surfaces, a drift layer of the second conductivity type disposed on the first surface of the second semiconductor substrate and having a cell section, a channel layer of the first conductivity type disposed at a surface portion of the cell section of the drift layer, a source region of the second conductivity type disposed at a surface portion of the channel layer, a gate insulating layer disposed on a channel region provided at a portion of the channel layer located between the source region and the drift layer, a gate electrode disposed on an opposite side of the gate insulating layer from the channel region, a source electrode electrically coupled with the channel layer and the source region, a second surface drain electrode disposed on the second surface of the second semiconductor substrate. The first chip and the second chip are integrated in such a manner that the second surface of the first chip and the source electrode of the second chip face to each other and are electrically coupled with each other through a conductive material.

In the semiconductor device according to the fourth aspect, the first chip and the second chip can be integrated by attaching the second surface of the first chip to the source electrode of the second chip. Thus, a lead frame is not required to be disposed between the first chip and the second chip. Therefore, a dimension of the semiconductor device can be reduced compared with a case where the lead frame is disposed.

BRIEF DESCRIPTION OF THE DRAWINGS

Additional objects and advantages of the present invention will be more readily apparent from the following detailed description of exemplary embodiments when taken together with the accompanying drawings. In the drawings:

FIG. 4A and FIG. 4B are diagrams illustrating processes for manufacturing the semiconductor device illustrated in FIG. 1;

FIG. 15A is a diagram illustrating a cross-sectional view of the semiconductor device illustrated in FIG. 1 provided with lead frames as terminals for coupling the semiconductor device with an external device;

DETAILED DESCRIPTION OF THE EXEMPLARY EMBODIMENTS

First Embodiment

Figure 1:
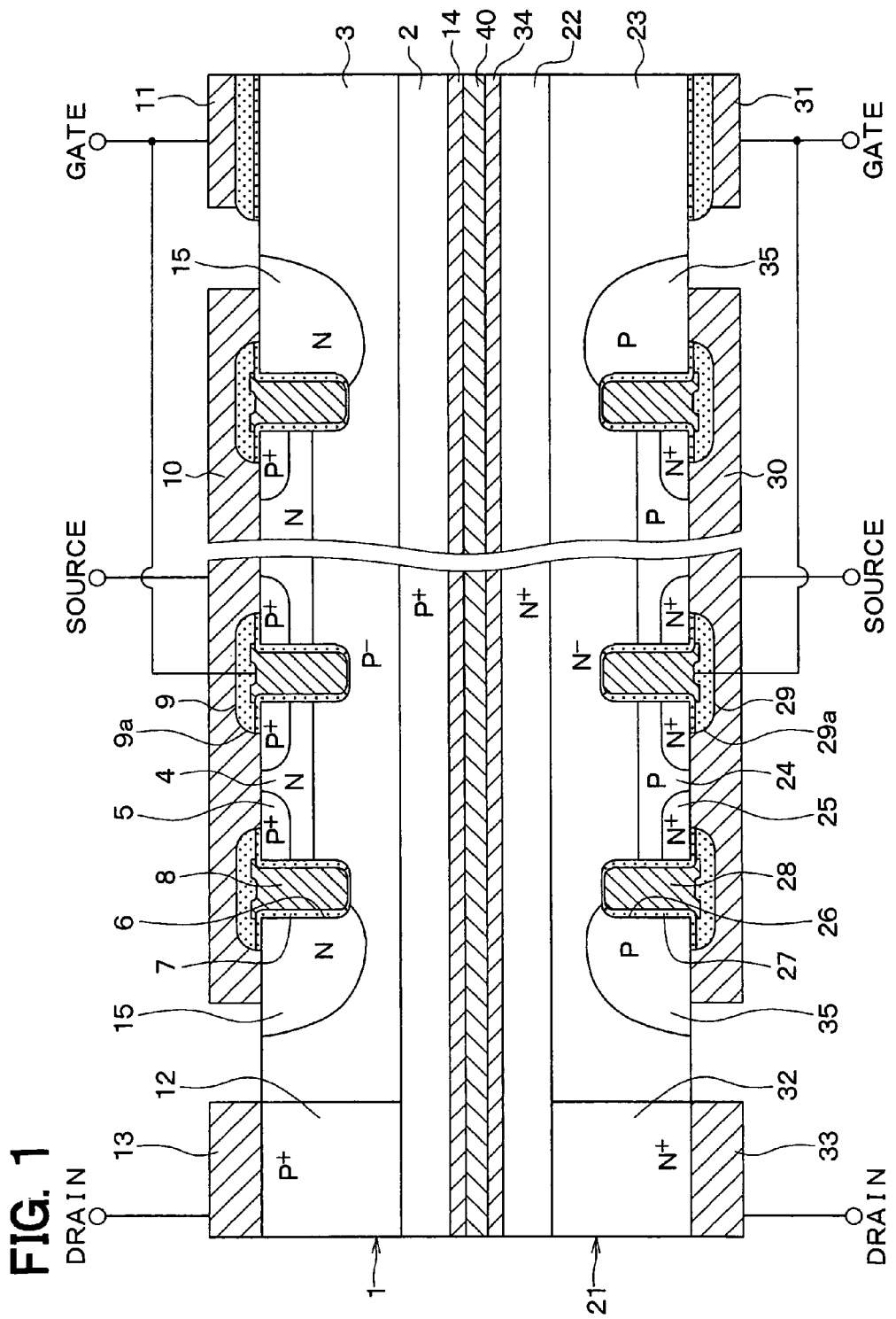
FIG. 1 a diagram illustrating a cross-sectional view of a semiconductor device according to a first embodiment of the present invention.
Figure 2:
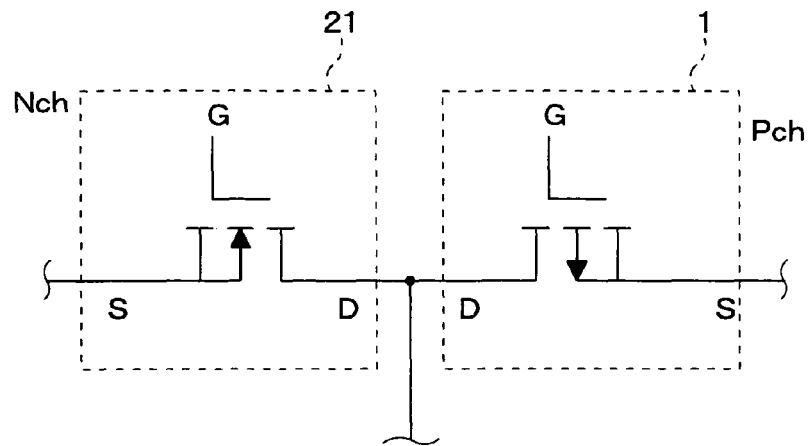
FIG. 2 is a diagram illustrating an equivalent circuit of the semiconductor device illustrated in FIG. 1.

A semiconductor device according to a first embodiment of the present invention will be described with reference to FIG. 1 and FIG. 2.

The semiconductor device includes a first chip 1 and a second chip 21. Each of the first chip 1 and the second chip 21 includes a power MOSFET having a trench gate structure as a vertical power device. A second surface of the first chip 1 is attached to a second surface of the second chip 21 so that the first chip 1 is integrated with the second chip 2.

The first chip 1 includes a P channel power MOSFET. The first chip 1 includes a P+ type silicon substrate 2. The P+ type silicon substrate 2 has first and second opposing surfaces. On the first surface of the P+ type silicon substrate 2, a P− type drift layer 3 is epitaxially formed. The P− type drift layer 3 has a cell section. An N type channel layer 4 is disposed at a surface portion of the cell section of the P− type drift layer 3. A P+ type source region 5 is disposed at a surface portion of the N type channel layer 4. The P+ type source region 5 is shallower than the N type channel layer 4. In addition, a plurality of trench gate structures is formed in the P− type drift layer 3. Each of the trench gate structure is configured by a trench 6, a gate insulating layer 7, and a gate electrode 8. The trench 6 penetrates the P+ type source region 5 and the N type channel layer 4 and reaches the P− type drift layer 3. The gate insulating layer 7 is formed on an inner wall of the trench 6. The gate electrode 8 is formed on a surface of the gate insulating layer 7 so as to fill the trench 6. In the above-described structure, a surface portion of the N type channel layer 4 located between the P+ type source region 5 and the P− type drift layer 3 can function as a channel region. The gate insulating layer 7 is disposed on the channel region. The gate electrode 8 is disposed on an opposite side of the gate insulating layer 7 from the channel region.

On the gate electrode 8, an interlayer insulating layer 9 is formed. On the interlayer insulating layer 9, a source electrode 10 and a gate wire 11 is formed. The source electrode 10 is electrically coupled with the N type channel layer 4 and the P+ type source region 5 through a contact hole 9a provided in the interlayer insulating layer 9. The gate wire 11 is disposed on the drift layer 3 so as to be apart from the cell section. The gate wire 11 is electrically coupled with the gate electrode 8 through a contact hole (not shown) provided in the interlayer insulating layer 9 on a cross section other than a cross section illustrated in FIG. 1.

A P+ type contact layer 12 is formed in the P− type drift layer 3 so as to be apart from the trench gate structures. On the P+ type contact layer 12, a first-surface drain electrode 13 is formed. Thereby, the first chip 1 has an up-drain structure. On the second surface of the P+ type silicon substrate 2, a second-surface drain electrode 14 is formed. The second-surface drain electrode 14 is electrically coupled with the second chip 21.

At an outermost trench gate structure, an N type field relaxing layer 15 is formed. The N type field relaxing layer 15 is in contact with the trench 6 and covers an outer edge portion of the trench 6. The N type field relaxing layer 15 can relax electric field applied to the outer edge portion of the trench 6.

Thereby, an electric field concentration at the outer edge portion of the trench 6 can be restricted and a damage of the gate insulating layer 7 due to the electric field concentration can be restricted.

The second chip 21 includes an N channel power MOSFET. The second chip 21 includes an N+ type silicon substrate 22. The N+ type silicon substrate 22 has first and second opposing surfaces. On the first surface of the N+ type silicon substrate 22, an N− type drift layer 23 is epitaxially formed. The N− type drift layer 23 has a cell section. A P type channel layer 24 is formed at a surface portion of the cell section in the N− type drift layer 23. An N+ type source region 25 is formed at a surface portion of the P type channel layer 24. The N+ type source region 25 is shallower than the P type channel layer 24. In addition, a plurality of trench gate structures is formed in the N− type drift layer 23. Each of the trench gate structure is configured by a trench 26, a gate insulating layer 27, and a gate electrode 28. The trench 26 penetrates the N+ type source region 25 and the P type channel layer 24 and reaches the N− type drift layer 3. The gate insulating layer 27 is formed on an inner wall of the trench 26. The gate electrode 28 is formed on a surface of the gate insulating layer 27 so as to fill the trench 26. In the above-described structure, a surface portion of the P type channel layer 24 located between the N+ type source region 25 and the N− type drift layer 23 can function as a channel region. The gate insulating layer 27 is formed on the channel region. The gate electrode 28 is disposed on an opposite side of the gate insulating layer 27 from the channel region.

On the gate electrode 28, an interlayer insulating layer 29 is formed. On the interlayer insulating layer 29, a source electrode 30 and a gate wire 31 is formed. The source electrode 30 is electrically coupled with the P type channel layer 24 and the N+ type source region 25 through a contact hole 29a provided in the interlayer insulating layer 29. The gate wire 31 is disposed on the N− type drift layer 23 so as to be apart from the cell section. The gate wire 31 is electrically coupled with the gate electrode 28 through a contact hole (not shown) provided in the interlayer insulating layer 29 on a cross section other than a cross section illustrated in FIG. 1.

An N+ type contact layer 32 is formed in the N− type drift layer 23 so as to be apart from the trench gate structures. On the N+ type contact layer 32, a first-surface drain electrode 33 is formed. On the second surface of the N+ type silicon substrate 22, a second-surface drain electrode 34 is formed. The second-surface drain electrode 34 is electrically coupled with the first chip 1.

At an outermost trench gate structure, a P type field relaxing layer 35 is formed. The P type field relaxing layer 35 is in contact with the trench 6 and covers an outer edge portion of the trench 26. The P type field relaxing layer 35 can relax electric field applied to the outer edge portion of the trench 26. Thereby, an electric field concentration at the outer edge portion of the trench 26 can be restricted and a damage of the gate insulating layer 27 due to the electric field concentration can be restricted.

The second-surface drain electrode 14 of the first chip 1 is attached to the second-surface drain electrode 34 of the second chip 21 through a conductive member 40. The conductive member 40 includes, for example, a solder or an electrically conductive adhesive.

In the semiconductor device having the above-described configuration, a drain of the P channel power MOSFET (Pch) is electrically coupled with a drain of the N channel power MOSFET (Nch). Thus, an equivalent circuit illustrated in FIG. 2 is configured.

In the above-described way, each of the first chip 1 and the second chip 21 includes the vertical power MOSFET and the second surface of the first chip 1 is attached to the second surface of the second chip 21. Thereby, the first chip 1 and the second chip 21 are integrated. In such a configuration, a lead frame is not required to be disposed between the first chip 1 and the second chip 21. Thus, a dimension of the semiconductor device can be reduced. An electric coupling between each of the first chip 1 and the second chip 21 with an external device is not described above. The source electrode 10 of the first chip 1 and the source electrode 30 of the second chip 21 may be electrically coupled with the external device through a lead frame. In such a case, the source electrodes 10 and 30 may be directly joined with the lead frame or the source electrodes 10 and 30 may be joined with the lead frame through a heat sink.

An exemplary method of manufacturing the semiconductor device according to the present embodiment will be described with reference to FIG. 3A to FIG. 4B.

Figure 3A:
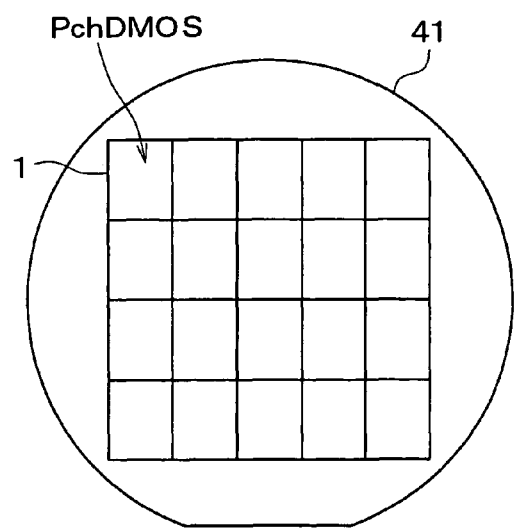
FIG. 3A and FIG. 3B are diagrams illustrating top view of wafers used for producing the semiconductor device illustrated in FIG. 1.
Figure 3B:
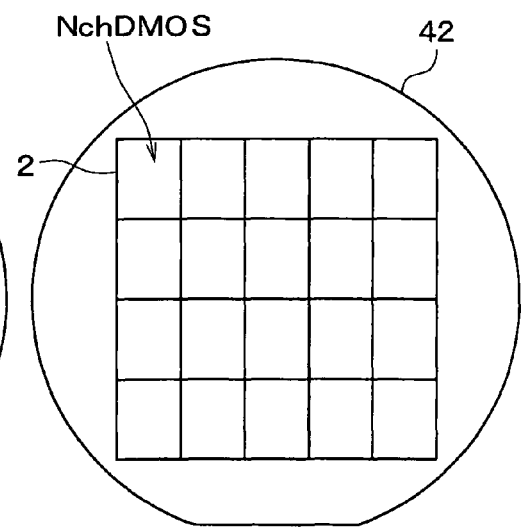

First, a first wafer 41 is prepared and the above-described P channel power MOSFET (PchDMOS) is formed in the first wafer 41 as illustrated in FIG. 3A. In addition, a second wafer 42 is prepared and the above-described N channel power MOSFET (NchDMOS) is formed in the second wafer 42 as illustrated in FIG. 3B. Specifically, a plurality of the first chips 1 is formed in the first wafer 41 and a plurality of the second chips 21 is formed in the second wafer 42.

The first wafer 41 and the second wafer 42 are arranged in such a manner that the second-surface drain electrode 14 of the first wafer 41 faces to the second-surface drain electrode 34 of the second wafer 42. The first wafer 41 and the second wafer 42 are attached to each other through the conductive member 40, as illustrated in FIG. 4A. Then, the integrated first wafer 41 and second wafer 42 is diced along scribe lines provided on the first wafer 41 and the second wafer 42. Thereby, the first wafer 41 and the second wafer 42 are divided into chips, and the semiconductor device including the first chip 1 and the second chip 21 attached to each other is formed.

In the above-described method, the first wafer 41 and the second wafer 42 are attached to each other in a state where each of the first wafer 41 and the second wafer 42 has the wafer shape, and the integrated first wafer 41 and second wafer 42 is diced into chips. Thus, the number of a process for packaging the chips can be reduced.

Second Embodiment

Figure 5:
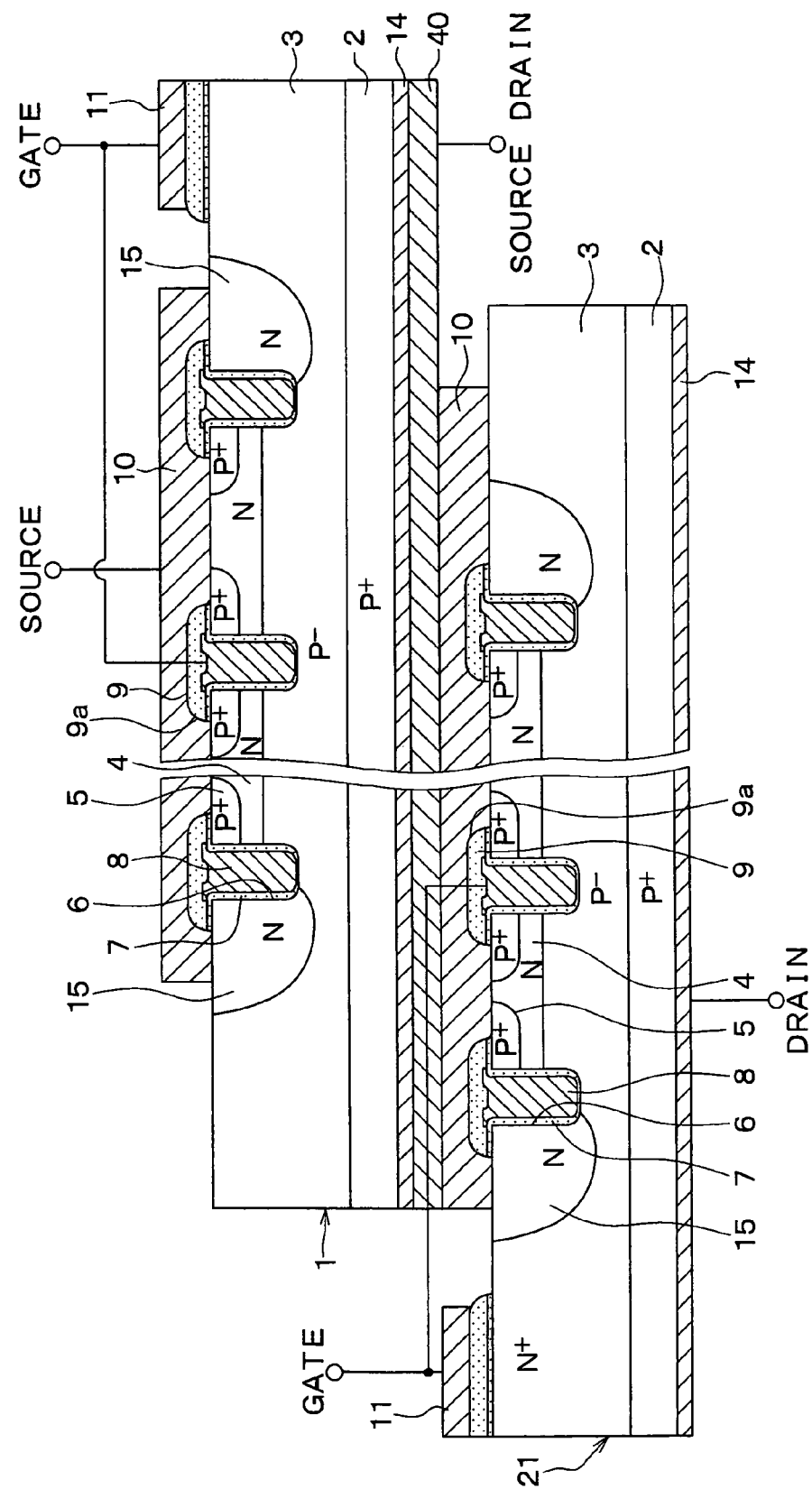
FIG. 5 is a diagram illustrating a cross-sectional view of a semiconductor device according to a second embodiment of the present invention.
Figure 6:
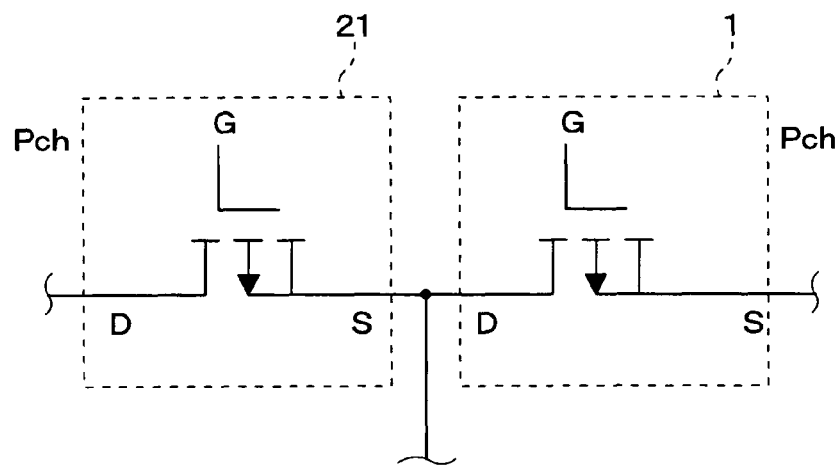
FIG. 6 is a diagram illustrating an equivalent circuit of the semiconductor device illustrated in FIG. 5.

A semiconductor device according to second embodiment of the present invention will be described with reference to FIG. 5 and FIG. 6. In the semiconductor device according to the first embodiment, the first chip 1 includes the P channel power MOSFET and the second chip 21 includes the N channel power MOSFET. In the semiconductor device according to the present embodiment, both of the first chip 1 and the second chip 21 includes a P channel MOSFET.

The P channel MOSFETs in the first chip 1 and the second chip 21 of the present embodiment are similar to the P channel MOSFET in the first chip 1 of the first embodiment. However, in the present embodiment, the first chip 1 and the second chip 21 do not have the up-drain structure. Thus, the P+ type contact layer 12 and the first-surface drain electrode 13 illustrated in FIG. 1 are not provided.

The second-surface drain electrode 14 of the first chip 1 is electrically coupled with the source electrode 10 of the second chip 21 through the conductive member 40. The first chip 1 is shifted to one side in a horizontal direction with respect to the second chip 21 so that the gate wire 11 of the second chip 21 is exposed to an outside from the first chip 1.

In the semiconductor device having the above-described configuration, a drain of the P channel power MOSFET formed in the first chip 1 is electrically coupled with a drain of the P channel power MOSFET formed in the second chip 2. Thus, an equivalent circuit illustrated in FIG. 6 is configured. The semiconductor device according to the present embodiment can have effects similar to the above-described effects of the semiconductor device according to the first embodiment.

An exemplary method of manufacturing the semiconductor device according to the present embodiment will be described with reference to FIG. 7A to FIG. 8C.

First, a first wafer 41 and a second wafer 42 are prepared. In each of the first wafer 41 and the second wafer 42, the above-described P channel power MOSFET (PchDMOS) is formed. That is, in each of the first wafer 41 and the second wafer 42, semiconductor elements before being divided into chips are formed. The same P channel power MOSFETs are formed in the first wafer 41 and the second wafer 42. Pulling-out positions of the gate wires 11 of the P channel power MOSFETs in the first wafer 41 and pulling-out positions of the gate wires 11 of the P channel power MOSFETs in the second wafer 42 may be bilaterally symmetric.

Figure 7A:
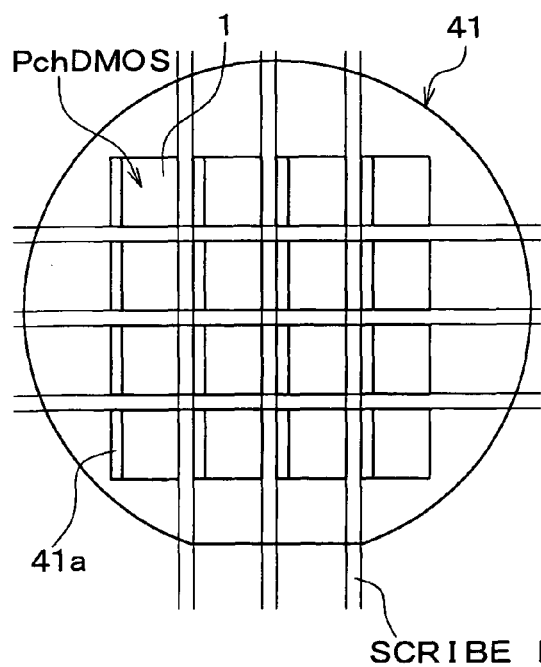
FIG. 7A and FIG. 7B are diagrams illustrating top view of wafers used for producing the semiconductor device illustrated in FIG. 5.
Figure 7B:
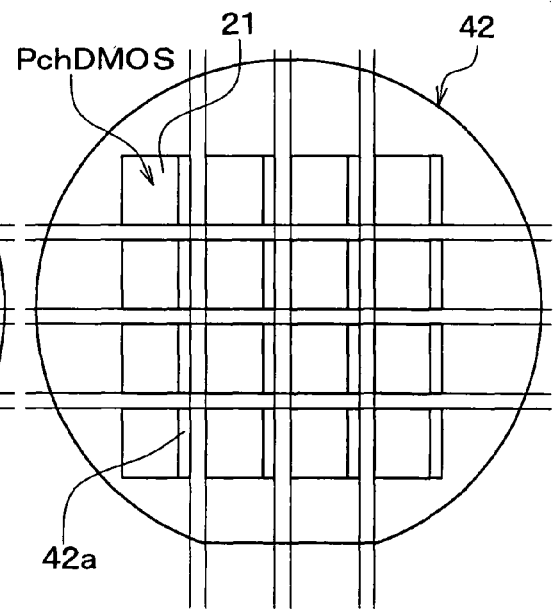
Figure 8A:
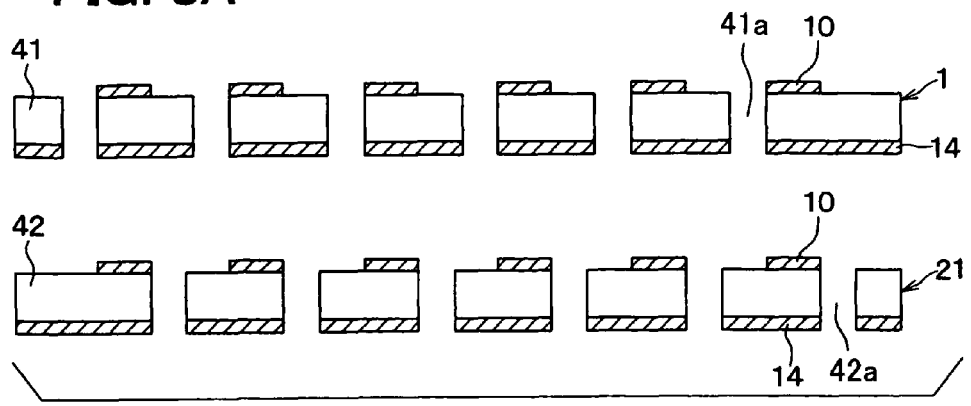
FIG. 8A to FIG. 8C are diagrams illustrating processes for manufacturing the semiconductor device illustrated in FIG. 5.

In the first wafer 41, a plurality of through hole 41a is provided at portions corresponding to a part of a periphery of the respective first chips 1. In the second wafer 42, a plurality of through hole 42a is provided at portions corresponding to a part of a periphery of the respective second chips 21. For example, the through holes 41a are provided at a left side of the respective first chips 1 as illustrated in FIGS. 7A and 8A, and the through holes 42a are provided at a right side of the respective second chips 21 as illustrated in FIG. 7B and FIG. 8A.

Figure 8B:
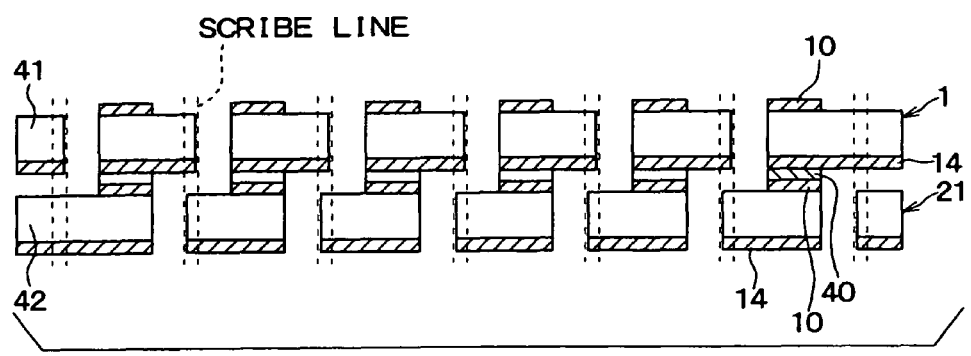
Figure 8C:
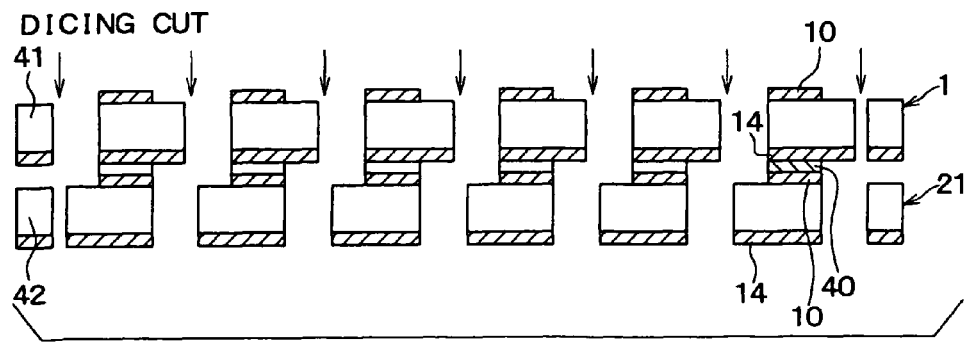

Then, as illustrated in FIG. 8B, the first wafer 41 is disposed on the second wafer 42. The second-surface drain electrode 14 of the first wafer 41 is joined with the source electrode 10 of the second wafer 42 through the conductive member 40. The conductive member includes, for example, a solder or an electric conductive adhesive. For example, a solder is formed on a surface of the source electrode 10 or a surface of the second-surface drain electrode 14 by plating. Then, the first wafer 41 and the second wafer 42 are arranged and are heated. Thereby, the second-surface drain electrode 14 of the first wafer 41 is joined with the source electrode 10 of the second wafer 42 through the conductive member 40. When the first wafer 41 and the second wafer 42 are arranged in such a manner that the first chips 1 corresponds to the second chips 21, the gate wires 11 of the P channel power MOSFETs formed in the second wafer 42 are exposed to an outside through the through holes 41a provided in the first wafer 41.

Then, the first wafer 41 and the second wafer 42 are diced together along scribe lines. Thereby, the first wafer 41 and the second wafer 42 are divided into chips, and the semiconductor device including the first chip 1 and the second chip 21 attached to each other is formed.

Third Embodiment

Figure 9:
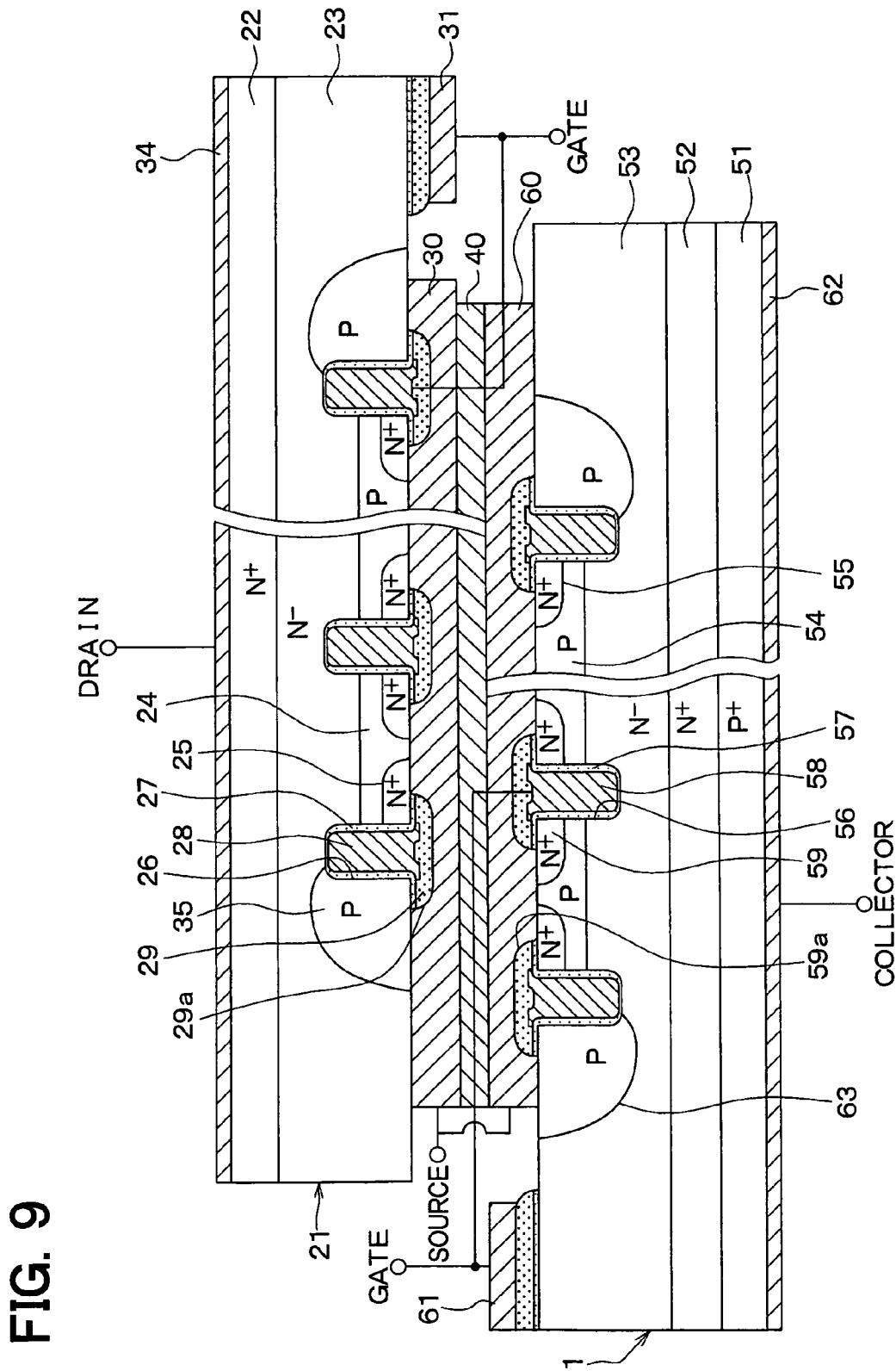
FIG. 9 is a diagram illustrating a cross-sectional view of a semiconductor device according to a third embodiment of the present invention.
Figure 10:
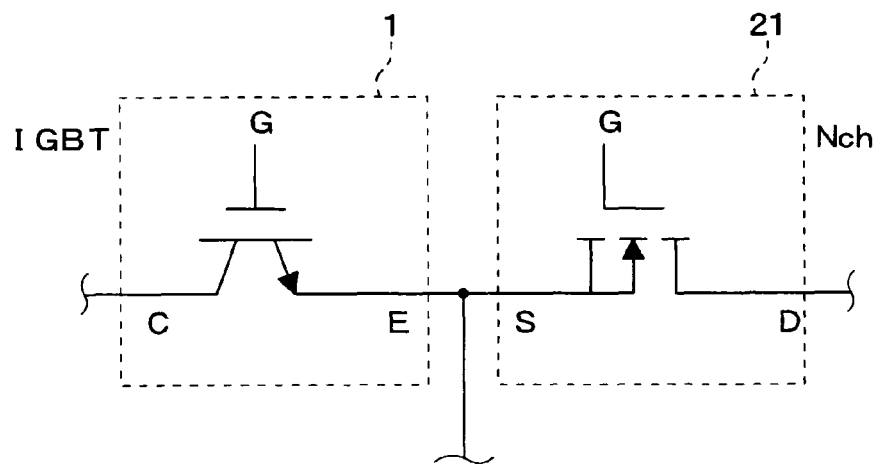
FIG. 10 is a diagram illustrating an equivalent circuit of the semiconductor device illustrated in FIG. 9.

A semiconductor device according to a third embodiment of the present invention will be described with reference to FIG. 9 and FIG. 10.

The semiconductor according to the present embodiment includes a first chip 1 and a second chip 21. The first chip 1 includes an N channel IGBT. The second chip 21 includes an N channel power MOSFET. The N channel power MOSFET in the second chip 21 according to the present embodiment is similar to the N channel power MOSFET in the second chip 21 according to the first embodiment. However, in the present embodiment, the second chip 21 does not have the up-drain structure. Thus, the N+ type contact layer 32 and the first-surface drain electrode 33 illustrated in FIG. 1 are not provided.

The N channel IGBT formed in the first chip 1 includes a P+ type silicon substrate 51. On a first surface of the P+ type silicon substrate 51, an N+ type buffer layer 52 and an N– type drift layer 53 are epitaxially formed. The N– type drift layer 53 includes a cell section. A P type channel layer 54 is formed at a surface portion of the cell section of the N– type drift layer 53. An N+ type emitter region 55 is formed at a surface portion of the P type channel layer 54. The N+ type emitter region 55 is shallower than the P type channel layer 54. In addition, a plurality of trench gate structures is formed in the N– type drift layer 53. Each of the trench gate structure is configured by a trench 56, a gate insulating layer 57, and a gate electrode 58. The trench 56 penetrates the N+ type emitter region 55 and the P type channel layer 54 and reaches the N– type drift layer 53. The gate insulating layer 57 is formed on an inner wall of the trench 56. The gate electrode 58 is formed on a surface of the gate insulating layer 57 so as to fill the trench 56. In the above-described structure, a surface portion of the P type channel layer 54 located between the N+ type emitter region 55 and the N– type drift layer 53 can function as a channel region. The gate insulating layer 57 is disposed on the channel region. The gate electrode 58 is disposed on an opposite side of the gate insulating layer 57 from the channel region.

On the gate electrode 58, an interlayer insulating layer 59 is formed. On the interlayer insulating layer 59, an emitter electrode 60 and a gate wire 61 is formed. The emitter electrode 60 is electrically coupled with the P type channel layer 54 and the N+ type emitter region 55 through a contact hole 59a provided in the interlayer insulating layer 59. The gate wire 61 is disposed on the N– type drift layer 53 so as to be apart from the cell section. The gate wire 61 is electrically coupled with the gate electrode 58 through a contact hole (not shown) provided in the interlayer insulating layer 59 on a cross section other than a cross section illustrated in FIG. 9.

Furthermore, a second-surface collector electrode 62 is formed on a second surface of P+ type silicon substrate 51. Thereby, the N type IGBT is formed.

At an outermost trench gate structure, a P type field relaxing layer 63 is formed. The P type field relaxing layer 63 is in contact with the trench 56 and covers an outer edge portion of the trench 56. The P type field relaxing layer 63 can relax electric field applied to the outer edge portion of the trench 56. Thereby, an electric field concentration at the outer edge portion of the trench 56 can be restricted and a damage of the gate insulating layer 57 due to the electric field concentration can be restricted.

The source electrode 30 disposed on the first surface of the second chip 21 is electrically coupled with the emitter electrode 60 disposed on the first surface of the first chip 1 through the conductive member 40. The first chip 1 is shift to one side in the horizontal direction with respect to the second chip 21 so that the gate wire 31 of the second chip 21 is exposed to the outside from the first chip 1 and the gate wire 61 of the first chip 1 is exposed to the outside from the second chip 21.

In the semiconductor device having the above-described configuration, the N channel power MOSFET formed in the second chip 21 is electrically coupled with the N channel IGBT formed in the first chip 1. Thus, an equivalent circuit illustrated in FIG. 10 is configured. The semiconductor device according to the present embodiment can have effects similar to the above-described effects of the semiconductor device according to the first embodiment.

An exemplary method of manufacturing the semiconductor device according to the present embodiment will be described with reference to FIG. 11A to FIG. 12C.

Figures 11A, 11B:
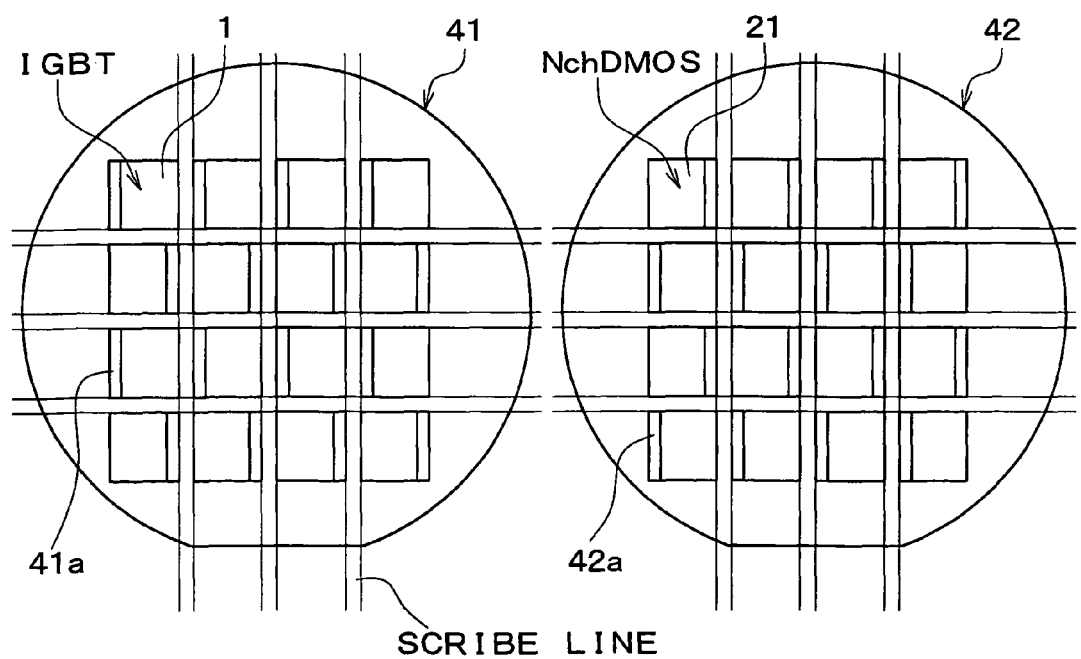
FIG. 11A and FIG. 11B are diagrams illustrating top view of wafers used for producing the semiconductor device illustrated in FIG. 9.

First, a first wafer 41 is prepared and the above-described N channel IGBT is formed in the first wafer 41 as illustrated in FIG. 11A. In addition, a second wafer 42 is prepared and the above-described N channel power MOSFET (NchDMOS) is formed in the second wafer 42 as illustrated in FIG. 11B. That is, in each of the first wafer 41 and the second wafer 42, semiconductor elements before being divided into chips are formed.

In the first wafer 41, a plurality of through holes 41a is provided at portions corresponding to a part of a periphery of the respective first chips 1. In the second wafer 42, a plurality of through holes 42a is provided at portions corresponding to a part of a periphery of the respective second chips 21. For example, in the first wafer 41, the through holes 41a are provided at a left side of the respective first chips 1 arranged in odd lines including a first line and a third line from the top and the through holes 41a are provided at a right side of the respective first chips 1 arranged in even lines including a second line and a fourth line from the top, as illustrated in FIG. 11A. In the second wafer 42, the through holes 42a are provided at a right side of the respective second chips 21 arranged in odd lines including a first line and a third line from the top and the through holes 42a are provided at a left side of the respective second chips 21 arranged in even lines including a second line and a fourth line from the top.

Figure 12A:
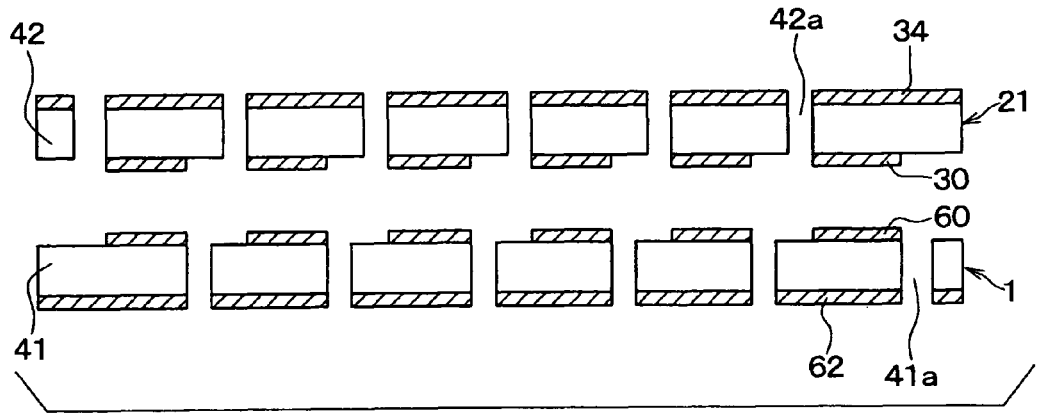
FIG. 12A to FIG. 12C are diagrams illustrating processes for manufacturing the semiconductor device illustrated in FIG. 9.
Figure 12B:
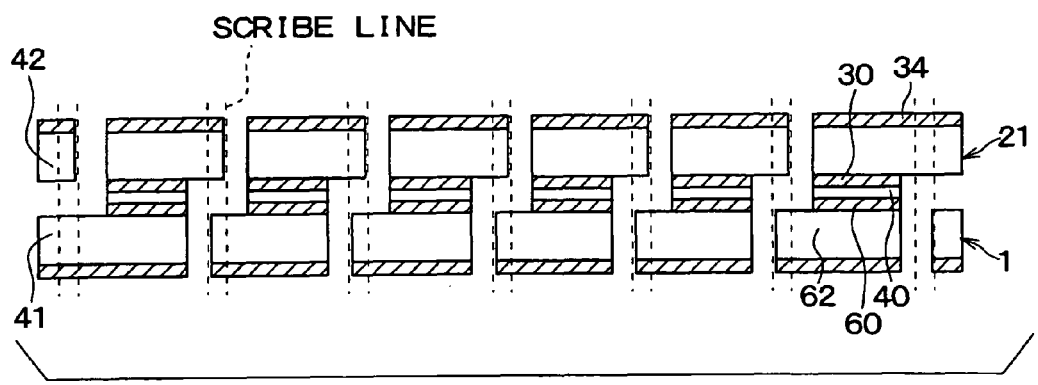

Then, as illustrated in FIG. 12B, the first wafer 41 is disposed on the second wafer 42. The first-surface emitter electrode 60 of the first wafer 41 is joined with the source electrode 30 of the second wafer 42 through the conductive member 40. The conductive member 40 includes, for example, a solder or an electric conductive adhesive. For example, a solder is formed on a surface of the source electrode 30 or a surface of the first-surface emitter electrode 60 by plating. Then, the first wafer 41 and the second wafer 42 are arranged and are heated. Thereby, the first-surface emitter electrode 60 of the first wafer 41 is electrically coupled with the source electrode 30 of the second wafer 42 through the conductive member 40. When the first wafer 41 and the second wafer 42 are arranged in such a manner that the first chips 1 correspond to the second chips 21, the gate wires 31 of the N channel power MOSFETs formed in the second wafer 42 are exposed to the outside through the through holes 41a provided in the first wafer 41. Furthermore, the gate wires 61 of the N channel IGBT formed in the first wafer 41 are exposed to the outside through the through holes 42a provided in the second wafer 42.

Figure 12C:
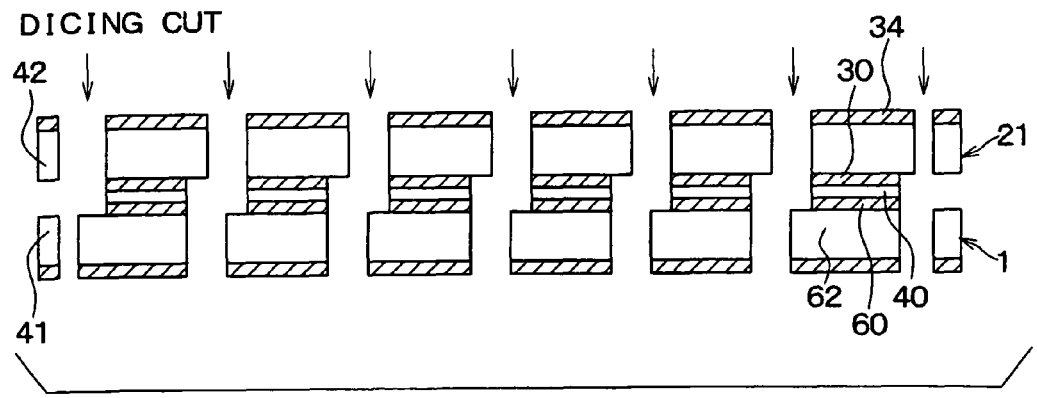

Then, the integrated first wafer 41 and the second wafer 42 are diced along scribe lines as illustrated in FIG. 12C. Thereby, the first wafer 41 and the second wafer 42 are divided into chips, and the semiconductor device including the first chip 1 and the second chip 21 attached to each other is formed.

In the semiconductor device according to the present embodiment, the through holes 41a are provided in the first wafer 41 in a zigzag manner as illustrated in FIG. 11A, and the through holes 42a are provided in the second wafer 42 in a zigzag manner as illustrated in FIG. 11B. When a power semiconductor element is formed of a silicon substrate having a (100)-surface, the semiconductor element is susceptible to break in a vertical direction and a horizontal direction.

However, if the through holes 41a and the holes 42a are not provided in a line manner as illustrated in FIG. 11A and FIG. 11B, the first wafer 41 and the second wafer 42 are restricted from breaking.

Fourth Embodiment

A semiconductor device according to a fourth embodiment of the present invention will be described with reference to FIG. 13A and 13B. The semiconductor device according to the present embodiment includes a first chip 1 and a second chip 21. The first chip 1 includes is a circuit chip including an electronic circuit or a circuit wiring. The second chip 21 includes an N channel power MOSFET. A predetermined portion of the electronic circuit or the circuit wiring in the first chip 1 is electrically coupled with the N channel MOSFET in the second chip 21 without a lead frame. The N channel MOSFET in the second chip 21 according to the present embodiment is similar to the N channel MOSFET in the second chip 21 according to the first embodiment. The second chip 21 is arranged in such a manner that the first surface, on which the source electrode 30 and the gate wire 31 are formed, faces to the first chip 1.

Figure 13A:
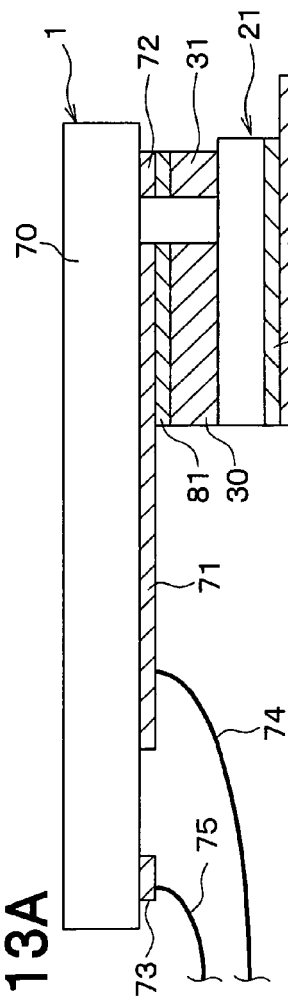
FIG. 13A is a diagram illustrating a cross-sectional view of a semiconductor device according to a fourth embodiment of the present invention and FIG. 13B is a diagram illustrating an enlarged view of a right section of the semiconductor device illustrated in FIG. 13A.

As illustrated in FIG. 13A, the first chip 1 includes a semiconductor substrate 70 and electrodes 71 and 72 formed on a surface of the semiconductor substrate 70. The source electrode 30 and the gate wire 31 in the N channel MOSFET are electrically coupled with the electrodes 71 and 72 through conductive members 81 and 82. Each of the conductive members 81 and 82 includes, for example, a solder. An area of the first chip 1 is larger than an area of the second chip 21. The first chip 1 is arranged in such a manner that one end of the first chip 1 protrudes outward with respect to one end of the second chip 21. The electrodes 71 extends toward the one end of the first chip 1. The first chip 1 further includes a pad 73. The pad 73 is disposed at a portion of the first chip 1 located outside of a joint portion with the second chip 21. The pad 73 can be used for electrically coupling the electronic circuit or the circuit wiring in the first chip 1 and an external device. To the electrode 71 and the pad 73, wires 74 and 75 are bonded. Thereby, each portion of the electronic circuit or the circuit wiring and each portion of power MOSFET can be electrically coupled with the external device. The second surface of the second chip 21 is electrically coupled with a lead frame 84 through a conductive member 83. The conductive member 83 includes, for example, a solder.

Figure 13B:
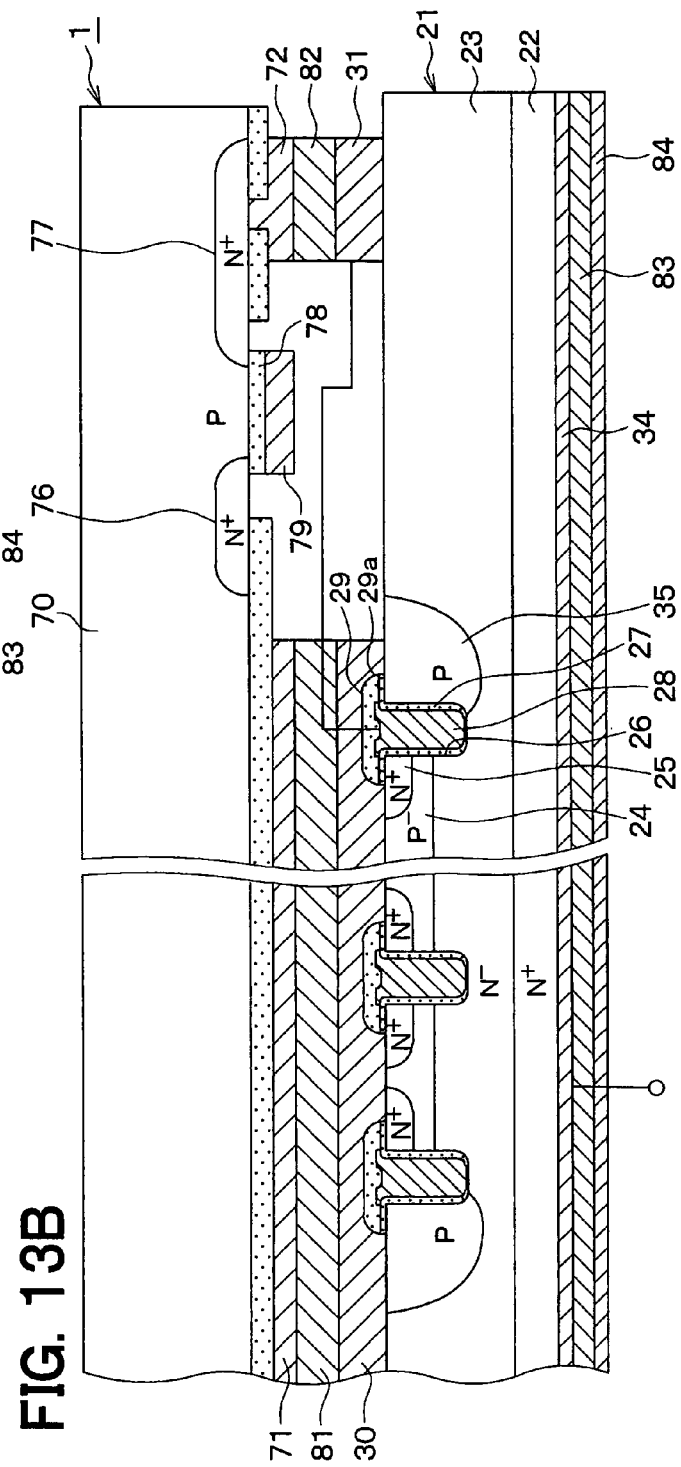

For example, the semiconductor substrate 70 is a P type substrate, as illustrated in FIG. 13B. On a surface portion of the semiconductor substrate 70 adjacent to the second chip 21, an N+ type source region 76 and an N+ type drain region 77 are formed. A channel region is provided between the N+ type source region 76 and the N+ type drain region 77. A gate insulating layer 78 is formed on the surface of the semiconductor substrate 2, a surface of the N+ type source region 76, and a surface of the N+ type drain region 79. The N+ type drain region 77 is coupled with the electrode 72. Thereby, the N+ type drain region 77 is electrically coupled with the gate wire 31. The gate wire 31 is electrically coupled with each of the gate electrode 28 on a cross section other than a cross section illustrated in FIG. 13B.

As described above, even if the first chip 1 is the circuit chip including the electronic circuit or the circuit wiring and the second chip 2 includes the vertical MOSFET, the first chip 1 and the second chip 21 can be integrated because the electrodes 71 and 72 are formed on the facing surface of the first chip 1 and the source electrode 30 and the gate wire 31 are formed on the facing surface of the second chip 2, and the electrodes 71 and 72 are attached to the source electrode 30 and the gate wire 31. In such a case, a lead frame is not required to be disposed between the first chip 1 and the second chip 2. Thus, a dimension of the semiconductor device can be reduced.

In the above-described example, the gate of the vertical power MOSFET is electrically coupled with the drain of the lateral MOSFET formed in the electronic circuit or the circuit wiring. If the second chip 21 includes a diode for detecting temperature or a current detecting cell having a current mirror circuit, the diode or the current detecting cell may be electrically coupled with a portion in the electronic circuit or the circuit wiring. In the above-described example, the semiconductor substrate 70 is the P type substrate. Alternatively, the semiconductor substrate 70 may be an N type substrate based on an element formed in the first chip 1.

Fifth Embodiment

A semiconductor device according to a fifth embodiment of the present invention will be described with reference to FIGS. 14A and 14B. The semiconductor device according to the present embodiment includes a first chip 1 and a second chip 21. The first chip 1 is a circuit chip including an electronic circuit or a circuit wiring. The second chip 21 includes an N channel power MOSFET. The first chip 1 further includes a vertical semiconductor element. Other then the vertical semiconductor element, the first chip 1 has a similar configuration to the first chip 1 according to the fourth embodiment.

Figure 14A:
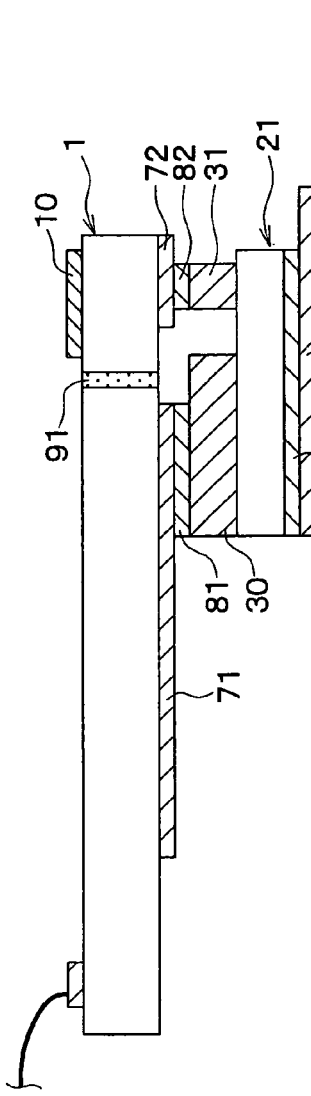
FIG. 14A is a diagram illustrating a cross-sectional view of a semiconductor device according to a fifth embodiment of the present invention and FIG. 14B is a diagram illustrating an enlarged view of a right section of the semiconductor device illustrated in FIG. 14A.
Figure 14B:
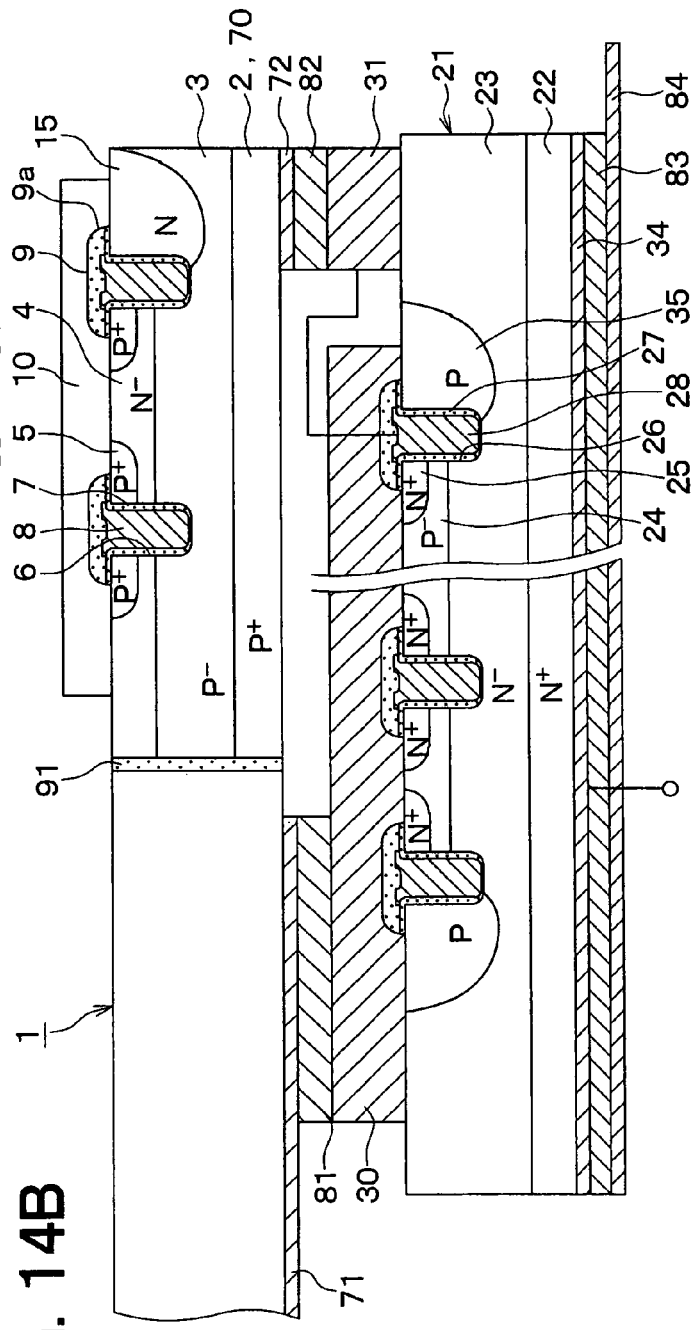

As illustrated in FIG. 14A, the source electrode 30 and the gate wire 31 in the second chip 21 are electrically coupled with the electrodes 71 and 72 formed on the surface of the semiconductor substrate 70 in the first chip 1 through the conductive members 81 and 82. The first chip 1 is isolated by an insulating layer 91. As illustrated in FIG. 14B, the vertical semiconductor element is formed at a portion of the first chip 1 isolated by the insulating layer 91. For example, a P channel power MOSFET is formed as the vertical type MOSFET. The P channel power MOSFET is similar to the P channel power MOSFET in the first chip 1 according to the first embodiment. The P+ type silicon substrate 2 corresponds to the semiconductor substrate 70 and can function as a drain. On the second surface of the P+ type silicon substrate 2, the electrode 72 that can function as a second-surface drain electrode is formed. In addition, the conductive member 82 is formed on the electrode 72. Thereby, the drain of the P channel power MOSFET is electrically coupled with the gate wire 31.

As described above, in a case where the first chip 1 is the circuit chip including the electronic circuit or the circuit wiring and the second chip 21 includes the vertical power MOSFET, the first chip 1 may further include a vertical power MOSFET and the vertical power MOSFET in the second chip 21 may be electrically coupled with vertical MOSFET in the first chip 1. If the second chip 21 includes a diode for detecting temperature or a current detecting cell having a current mirror circuit, the diode or the current detecting cell may be electrically coupled with a portion in the electronic circuit or the circuit wiring.

Other Embodiments

Although the present invention has been fully described in connection with the exemplary embodiments thereof with reference to the accompanying drawings, it is to be noted that various changes and modifications will become apparent to those skilled in the art.

Figure 15B:
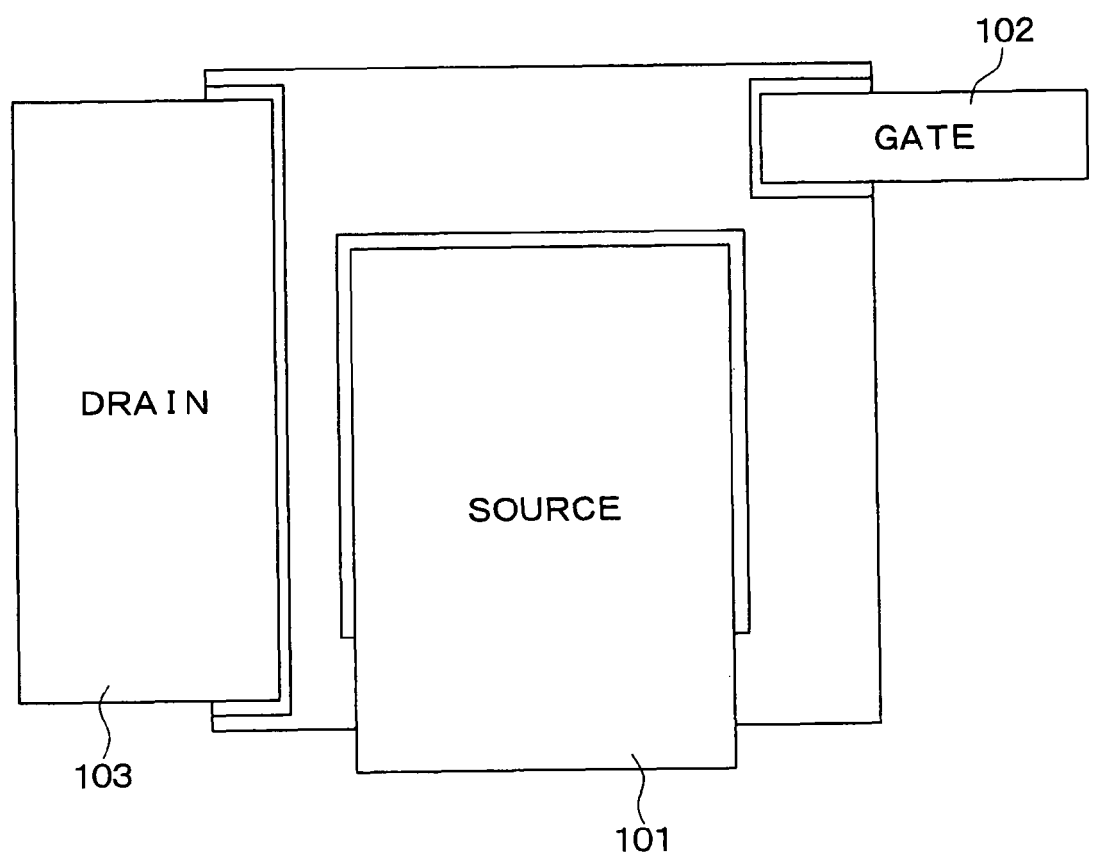
FIG. 15B is a diagram illustrating a top view of the semiconductor device illustrated in FIG. 15A.

For example, a terminal for coupling each of the above-described semiconductor devices and an external device can have various configurations. For example, lead frames 101 to 106 may be provided as a terminal for coupling the semiconductor device according to the first embodiment and an external device, as illustrated in FIGS. 15A and 15B. In the semiconductor device according to the first embodiment, the source electrode 10, the gate wire 11 and the first-surface drain electrode 13 are disposed on the first surface of the first chip 1, and the source electrode 30, the gate wire 31, and the first-surface drain electrode 33 are disposed on the second surface of the second chip 21. The lead frame 101 is electrically coupled with the source electrode 10, the lead frame 102 is electrically coupled with the gate wire 11, the lead frame 103 is electrically coupled with the first-surface drain electrode 13, the lead frame 104 is electrically coupled with the source electrode 30, the lead frame 105 is electrically coupled with the gate wire 31, and the lead frame 106 is electrically coupled with the first-surface drain electrode 33, for example, through a solder. The lead frames 101 to 106 extend to an outside of the semiconductor device. Even if the semiconductor device is molded with resin, the lead frames 101 to 106 protrude from the resin so that the lead frames 101 to 106 can function as the terminals. In the above-described example, the lead frames 101 to 106 are separately coupled with the source electrode 10, the gate wire 11, the first-surface drain electrode 13, the source electrode 30, the gate wire 31, and the first-surface drain electrode 33.

Figure 16A:
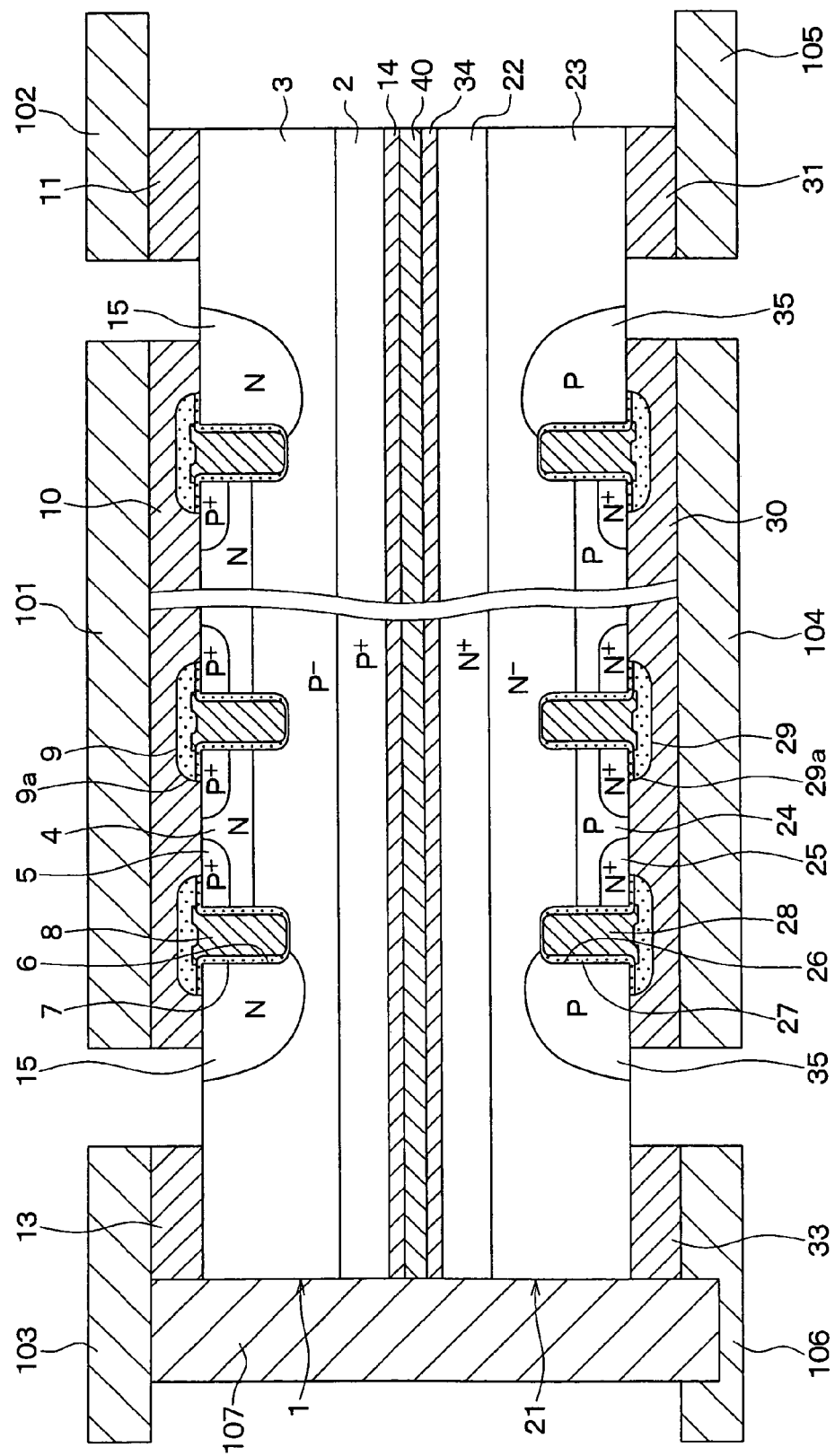
FIG. 16A is a diagram illustrating a cross-sectional view of a semiconductor device according to a modification.
Figure 16B:
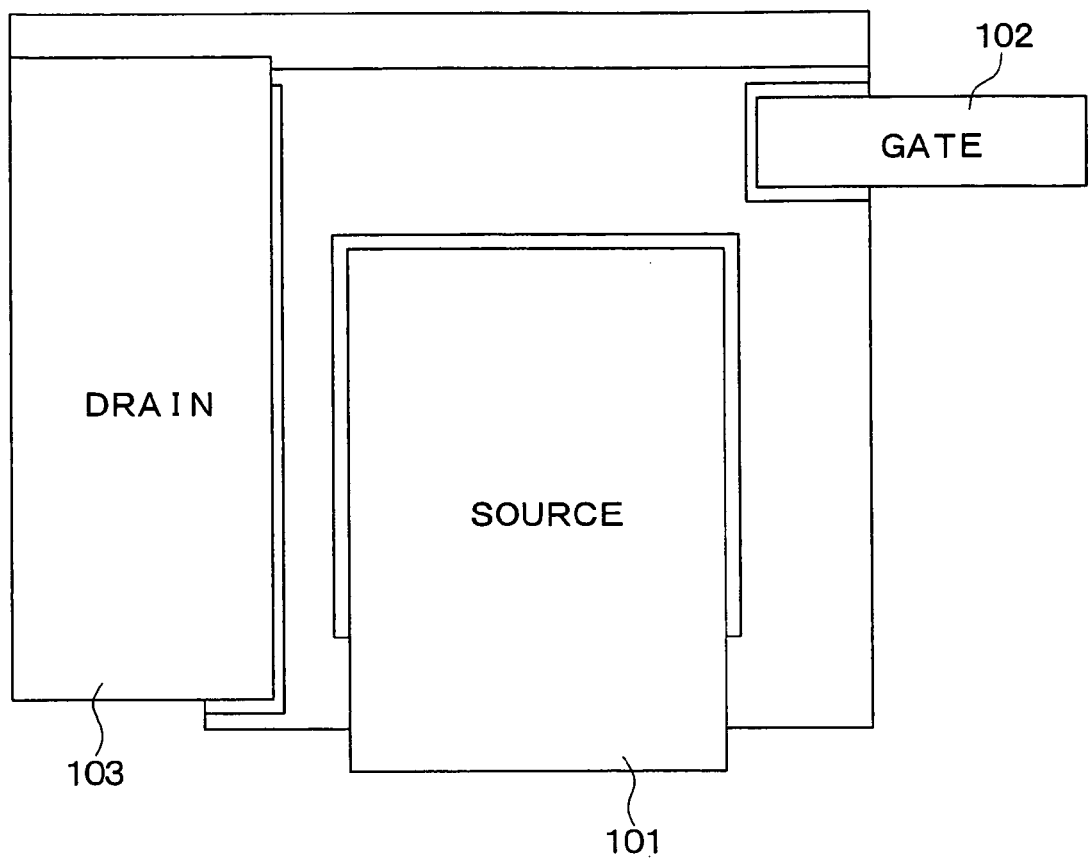
FIG. 16B is a diagram illustrating a top view of the semiconductor device according to the modification.

Alternatively, a lead frame may be shared. In a semiconductor device illustrated in FIG. 16A and FIG. 16B, a first chip 1 and a second chip 21 are similar to those of the first embodiment. However, the P+ type contact layer 12 and the N+ type contact layer 32 for configurating the up drain structure are not provided and a lead frame is shared. As illustrated in FIG. 21, a coupling element 107 is disposed along a side surface of the first chip 1 and the side surface of the second chip 21. The coupling element 107 couples the lead frame 103 and the lead frame 106. Thereby, the first-surface drain electrode 13 of the first chip 1, the first-surface drain electrode 33 of the second chip 21, the second-surface drain electrode 14 of the first chip 1, and the second-surface drain electrode 34 of the second chip 21 are electrically coupled. In addition, at the side surface of the first chip 1 and the side surface of the second chip 21, the P− type drift layer 3 and the N− type drift layer 23 are electrically coupled. Thus, up-drain structure is not required in the present semiconductor device.

In the first to third embodiments, the power MOSFET having the trench gate structure and the IGBT having the trench gate structure are provided as an example of the vertical power element. The vertical power element may also include a planer type power MOSFET and a planer type IGBT.

In the second embodiment, each of the first chip 1 and the second chip 21 includes the P channel power MOSFET. Alternatively, each of the first chip 1 and the second chip 21 may include an N channel power MOSFET. The semiconductor device according to the second embodiment may have an up-drain structure similar to the up-drain structure of the first embodiment.

In the second and the third embodiment, the first chip 1 and the second chip 21 are arranged in such a manner that the first wafer 41 is shifted with respect to the second wafer 42. Thereby, the first chip 1 and the second chip 21 are offset. Alternatively, the first wafer 41 and the second wafer 42 may be divided into the first chips 1 and the second chips 21 in advance, and the first chip 1 may be joined with the second chip 21 through the conductive member 40. In such a case, a joint is performed by chips. Thus, a manufacturing process may be complicated.

The layout of the through holes 41a and 42a in the second embodiment is different from the layout of the through holes 41a and 42a in the third embodiment. In the above-described embodiments, either one of the layout can be used.

In each of the semiconductor devices according to the first to fifth embodiments, two chips, that is, the first chip 1 and the second chip 21 are stacked. Alternatively, three or more chips may be stacked. Alternatively, two or more chips arranged in a horizontal direction may be stacked.

What is claimed is:

1. A semiconductor device comprising:
a first chip including a first conductivity type channel power MOSFET, the first conductivity type channel power MOSFET including a first semiconductor substrate of the first conductivity type having first and second opposing surfaces, a drift layer of the first conductivity type disposed on the first surface of the first semiconductor substrate and having a cell section, a channel layer of a second conductivity type disposed at a surface portion of the cell section of the drift layer, a source region of the first conductivity type disposed at a surface portion of the channel layer, a gate insulating layer disposed on a channel region provided at a portion of the channel layer located between the source region and the drift layer, a gate electrode disposed on an opposite side of the gate insulating layer from the channel region, a source electrode electrically coupled with the channel layer and the source region, a second-surface drain electrode disposed on the second surface of the first semiconductor substrate; and
a second chip including a second conductivity type channel power MOSFET, the second conductivity type channel power MOSFET including a second semiconductor substrate of the second conductivity type having first and second opposing surfaces, a drift layer of the second conductivity type disposed on the first surface of the second semiconductor substrate and having a cell section, a channel layer of the first conductivity type disposed at a surface portion of the cell section of the drift layer, a source region of the second conductivity type disposed at a surface portion of the channel layer, a gate insulating layer disposed on a channel region provided at a portion of the channel layer located between the source region and the drift layer, a gate electrode disposed on an opposite side of the gate insulating layer from the channel region, a source electrode electrically coupled with the channel layer and the source region, a second-surface drain electrode disposed on the second surface of the second semiconductor substrate, wherein
the first chip and the second chip are integrated in such a manner that the second-surface drain electrode of the first chip and the second-surface drain electrode of the second chip face to each other and are electrically coupled with each other through a conductive material.

2. The semiconductor device according to claim 1, wherein:
the first chip further includes a contact region of the first conductivity type and a first-surface drain electrode, the contact region extends from a surface of the drift layer to the first semiconductor substrate, the contact region has an impurity concentration greater than the drift layer, the first-surface drain electrode is electrically coupled with the contact region on a surface side of the drift layer so as to provide an up-drain structure; and
the second chip further includes a contact region of the second conductivity type and a first-surface drain electrode, the contact region extends from a surface of the drift layer to the second semiconductor substrate, the contact region has an impurity concentration greater than the drift layer, the first-surface drain electrode is electrically coupled with the contact region on a surface side of the drift layer so as to provide an up-drain structure.

3. The semiconductor device according to claim 1, further comprising:
a first lead frame disposed on the drift layer of the first chip;
a second lead frame disposed on the drift layer of the second chip; and
a coupling element electrically coupling the first lead frame and the second lead frame, the coupling element being in contact with a side surface of the first chip and a side surface of the second chip, the coupling element electrically coupled with the second-surface drain electrode of the first chip and the second-surface drain electrode of the second chip.

4. A method of manufacturing the semiconductor device according to claim 1, comprising:
preparing a first wafer for forming a plurality of the first chips and a second wafer for forming a plurality of the second chips;
forming the first conductivity-type channel power MOSFET in the first wafer;
forming the second conductivity-type channel power MOSFET in the second wafer;
arranging the first wafer and the second wafer in such a manner that the second-surface drain electrode of the first wafer faces to the second-surface drain electrode of the second wafer;
electrically coupling the second-surface drain electrode of the first wafer with the second-surface drain electrode of the second wafer through the conductive material so that the first wafer and the second wafer are integrated; and
dicing the integrated first wafer and second wafer into chips.

5. A semiconductor device comprising:
a first chip including a first conductivity type channel power MOSFET, the first conductivity type channel power MOSFET including a first semiconductor substrate of the first conductivity type having first and second opposing surfaces, a drift layer of the first conductivity type disposed on the first surface of the first semiconductor substrate and having a cell section, a channel layer of a second conductivity type disposed at a surface portion of the cell section of the drift layer, a source region of the first conductivity type disposed at a surface portion of the channel layer, a gate insulating layer disposed on a channel region provided at a portion of the channel layer located between the source region and the drift layer, a gate electrode disposed on an opposite side of the gate insulating layer from the channel region, a source electrode electrically coupled with the channel layer and the source region, a second-surface drain electrode disposed on the second surface of the first semiconductor substrate; and
a second chip including a first conductivity type channel power MOSFET, the first conductivity type channel power MOSFET including a second semiconductor substrate of the first conductivity type having first and second opposing surfaces, a drift layer of the first conductivity type disposed on the first surface of the second semiconductor substrate and having a cell section, a channel layer of the second conductivity type disposed at a surface portion of the cell section of the drift layer, a source region of the first conductivity type disposed at a surface portion of the channel layer, a gate insulating layer disposed on a channel region provided at a portion of the channel layer located between the source region and the drift layer, a gate electrode disposed on an opposite side of the gate insulating layer from the channel region, a source electrode electrically coupled with the channel layer and the source region, a second-surface drain electrode disposed on the second surface of the second semiconductor substrate, wherein the first chip and the second chip are integrated in such a manner that the second-surface drain electrode of the first chip and source electrode of the second chip face to each other and are electrically coupled with each other through a conductive material.

6. The semiconductor device according to claim 5, wherein:

the second chip further includes a gate wire, the gate wire is disposed on the drift layer so as to be apart from the cell section and is electrically coupled with the gate electrode of the second chip; and the first chip is shifted with respect to the second chip so that the gate wire is exposed to an outside from the first chip.

7. A method of manufacturing the semiconductor device according to claim 5, comprising:

preparing a first wafer for forming a plurality of the first chips and a second wafer for forming a plurality of the second chips;

forming the first conductivity type channel power MOSFET in the first wafer;

forming the first conductivity type channel power MOSFET in the second wafer;

arranging the first wafer and the second wafer in such a manner that the second-surface drain electrode of the first wafer faces to the source electrode of the second wafer;

electrically coupling the second-surface drain electrode of the first wafer with the source electrode of the second wafer through the conductive material so that the first wafer and the second wafer are integrated; and dicing the integrated first wafer and second wafer into chips.

8. A method of manufacturing the semiconductor device according to claim 6, comprising:

preparing a first wafer for forming a plurality of the first chips and a second wafer for forming a plurality of the second chips;

forming the first conductivity type channel power MOSFET in the first wafer;

forming the first conductivity type channel power MOSFET in the second wafer;

providing a through hole at a portion of the first wafer corresponding to a portion of the second wafer at which the gate wire is disposed;

arranging the first wafer and the second wafer in such a manner that the second-surface drain electrode of the first wafer faces to the source electrode of the second wafer and the gate wire is exposed to the outside from the through hole of the first wafer;

electrically coupling the second-surface drain electrode of the first wafer with the source electrode of the second wafer through the conductive material so that the first wafer and the second wafer are integrated; and dicing the integrated first wafer and second wafer into chips.

9. A semiconductor device comprising:

a first chip including a second conductivity type channel IGBT, the second conductivity type channel IGBT including a first semiconductor substrate of a first conductivity type having first and second opposing surfaces, a drift layer of the second conductivity type disposed to the first surface side of the first semiconductor substrate and having a cell section, a channel layer of the first conductivity type disposed at a surface portion of the cell section of the drift layer, an emitter region of the second conductivity type disposed at a surface portion of the channel layer, a gate insulating layer disposed on a channel region provided at a portion of the channel layer located between the emitter region and the drift layer, a gate electrode disposed on an opposite side of the gate insulating layer from the channel region, an emitter electrode electrically coupled with the channel layer and the emitter region, a second-surface collector electrode disposed on the second surface of the first semiconductor substrate; and a second chip including a second conductivity type channel power MOSFET the second conductivity type channel power MOSFET including a second semiconductor substrate of the second conductivity type having first and second opposing surfaces, a drift layer of the second conductivity type disposed on the first surface of the second semiconductor substrate and having a cell section, a channel layer of the first conductivity type disposed at a surface portion of the cell section of the drift layer, a source region of the second conductivity type disposed at a surface portion of the channel layer, a gate insulating layer disposed on a channel region provided at a portion of the channel layer located between the source region and the drift layer, a gate electrode disposed on an opposite side of the gate insulating layer from the channel region, a source electrode electrically coupled with the channel layer and the source region, a second-surface drain electrode disposed on the second surface of the second semiconductor substrate, wherein the first chip and the second chip are integrated in such a manner that the emitter electrode of the first chip and the source electrode of the second chip face to each other and are electrically coupled with each other through a conductive material.

10. The semiconductor device according to claim 9, wherein:

the first chip further includes a gate wire, the gate wire is disposed on the drift layer so as to be apart from the cell section and is electrically coupled with the gate electrode;

the second chip further includes a gate wire, the gate wire is disposed on the drift layer so as to be apart from the cell section and is electrically coupled with the gate electrode; and the first chip is shifted with respect to the second chip so that the gate wire of the first chip is exposed to an outside from the second chip and the gate wire of the second chip is exposed to the outside from first chip.

11. A method of manufacturing the semiconductor device according to claim 9, comprising:

preparing a first wafer for forming a plurality of the first chips and a second wafer for forming a plurality of the second chips;

forming the second conductivity type channel IGBT in the first wafer;

forming the second conductivity type channel power MOSFET in the second wafer;

arranging the first wafer and the second wafer in such a manner that the emitter electrode of the first wafer faces to the source electrode of the second wafer;

electrically coupling the emitter electrode of the first wafer with the source electrode of the second wafer through the conductive material so that the first wafer and the second wafer are integrated; and dicing the integrated first wafer and second wafer into chips.

12. A method of manufacturing the semiconductor device according to claim 10, comprising:

preparing a first wafer for forming a plurality of the first chips and a second wafer for forming a plurality of the second chips;

forming the second conductivity-type channel IGBT in the first wafer;

forming the second conductivity-type channel power MOSFET in the second wafer;

providing a through hole at a portion of the first wafer corresponding to a portion of the second wafer where the gate wire is disposed;

providing a through hole at a portion of the second wafer corresponding to a portion of the first wafer where the gate wire is disposed;

arranging the first wafer and the second wafer in such a manner that the emitter electrode of the first wafer faces to the source electrode of the second wafer, the gate wire of the second chip is exposed to the outside from the through hole of the first wafer, and the gate wire of the first wafer is exposed to the outside from the through hole of the second wafer;

electrically coupling the emitter electrode of the first wafer with the source electrode of the second wafer through the conductive material so that the first wafer and the second wafer are integrated; and dicing the integrated first wafer and second wafer into chips.

13. A semiconductor device comprising:

a first chip including a first semiconductor substrate and one of an electronic circuit and a circuit wiring formed in the semiconductor substrate, the first semiconductor substrate having one of a first conductivity type and a second conductivity type, the first semiconductor substrate having first and second opposing surfaces; and a second chip including a second conductivity type channel power MOSFET, the second conductivity type channel power MOSFET including a second semiconductor substrate of the second conductivity type having first and second opposing surfaces, a drift layer of the second conductivity type disposed on the first surface of the second semiconductor substrate and having a cell section, a channel layer of the first conductivity type disposed at a surface portion of the cell section of the drift layer, a source region of the second conductivity type disposed at a surface portion of the channel layer, a gate insulating layer disposed on a channel region provided at a portion of the channel layer located between the source region and the drift layer, a gate electrode disposed on an opposite side of the gate insulating layer from the channel region, a source electrode electrically coupled with the channel layer and the source region, a second surface drain electrode disposed on the second surface of the second semiconductor substrate, wherein the first chip and the second chip are integrated in such a manner that the second surface of the first chip and the source electrode of the second chip face to each other and are electrically coupled with each other through a conductive material.

14. The semiconductor device according to claim 13, wherein:

the first semiconductor substrate has the first conductivity-type;

the first chip further includes a lateral MOSFET;

the lateral MOSFET includes a source region of the second conductivity type disposed at the second surface side of the first semiconductor substrate, a drain region of the second conductivity type disposed at the second surface side of the first semiconductor substrate, a gate insulating layer disposed on a surface of a channel region provided between the source region and the drain region, and a gate electrode disposed on the gate insulating layer;

the second chip further includes a gate wire electrically coupled with the gate electrode of the second chip; and the gate wire is electrically coupled with the drain region of the first chip through a conductive material.

15. The semiconductor device according to claim 13, wherein:

the first semiconductor substrate has the first conductivity type;

the first chip further includes a first conductivity type channel vertical MOSFET;

the first conductivity type channel vertical MOSFET includes a drift layer of the first conductivity type disposed on the first surface of the first semiconductor substrate, a channel layer of the second conductivity type disposed at a surface portion of the drift layer, a source region of the first conductivity type disposed at a surface portion of the channel layer, an gate insulating layer disposed on a channel region provided at a portion of the channel layer located between the source region and the drift layer, a gate electrode disposed on an opposite side of the gate insulating layer from the channel region, a source electrode electrically coupled with the channel layer and the source region, a second-surface drain electrode disposed on the second surface of the first semiconductor substrate;

the second chip further includes a gate wire electrically coupled with the gate electrode of the second chip; and the gate wire is electrically coupled with the second-surface drain electrode of the first chip through a conductive material.

* * * * *